(12) United States Patent
Fujimoto et al.

(10) Patent No.: US 7,947,550 B2
(45) Date of Patent: May 24, 2011

(54) METHOD OF FORMING SEMICONDUCTOR DEVICE

(75) Inventors: Hiroyuki Fujimoto, Tokyo (JP); Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/873,802

(22) Filed: Sep. 1, 2010

(65) Prior Publication Data

US 2010/0330774 A1 Dec. 30, 2010

Related U.S. Application Data

(62) Division of application No. 12/388,062, filed on Feb. 18, 2009, now Pat. No. 7,808,052.

(30) Foreign Application Priority Data

Feb. 19, 2008 (JP) ................................. 2008-037575

(51) Int. Cl.
*H01L 21/8238* (2006.01)
(52) U.S. Cl. .. 438/218; 438/221; 438/427; 257/E21.545
(58) Field of Classification Search .................. 438/207, 438/218, 219, 221, 294, 427; 257/E21.545
See application file for complete search history.

(56) References Cited

U.S. PATENT DOCUMENTS

| 6,674,100 B2 | 1/2004 | Kubo et al. | |
|---|---|---|---|
| 2008/0176378 A1* | 7/2008 | Batra et al. ..................... | 438/427 |

FOREIGN PATENT DOCUMENTS

| JP | 09-102586 | 4/1997 |
|---|---|---|
| JP | 2001-144276 | 5/2001 |
| JP | 2006-237208 | 9/2006 |
| JP | 2007-227920 | 9/2007 |

* cited by examiner

*Primary Examiner* — Hoai V Pham
(74) *Attorney, Agent, or Firm* — Young & Thompson

(57) ABSTRACT

A semiconductor device may include, but is not limited to, first and second well regions, and a well isolation region isolating the first and second well regions. The first and second well regions each may include an active region, a device isolation groove that defines the active region, and a device isolation insulating film that fills the device isolation groove. The first and second well regions may include first and second well layers, respectively. The well isolation region may include a well isolation groove, a well isolation insulating film that fills the well isolation groove, and a diffusion stopper layer disposed under a bottom of the well isolation groove. The first and second well layers have first and second bottoms respectively, which are deeper in depth than a bottom of the device isolation groove and shallower in depth than the bottom of the well isolation groove.

14 Claims, 22 Drawing Sheets

METHOD OF FORMING SEMICONDUCTOR DEVICE

BACKGROUND OF THE INVENTION

1. Field of the Invention

The present invention generally relates to a semiconductor device and a method of forming the same.

Priority is claimed on Japanese Patent Application No. 2008-037575, filed Feb. 19, 2008, the content of which is incorporated herein by reference.

2. Description of the Related Art

In recent years, there has been the requirement for further increase in the density of semiconductor devices. To realize highly dense semiconductor devices, it has been proposed to reduce the area of a semiconductor chip and to increase the share rate of semiconductor cells. To realize reduction in the area of a semiconductor chip and increase the cell share rate, it would be effective to narrow the width of the well isolation region that separates the p-well region and the n-well region from each other.

For example, Japanese Unexamined Patent Application, First Publications, Nos. 2007-227920, 2001-144276, 2006-237208, and 09-102586 each address a method of forming a well isolation region with a wider width, which is shallower than well layers or diffusion layers.

SUMMARY

In one embodiment, a semiconductor device may include, but is not limited to, a first well region, a second well region, and a well isolation region. The well isolation region is disposed between the first well region and the second well region. The well isolation region isolates the first well region and the second well region from each other. The first and second well regions each may include, but is not limited to, an active region, a device isolation groove that defines the active region, and a device isolation insulating film that fills the device isolation groove. The first well region may include, but is not limited to, a first well layer. The second well region may include, but is not limited to, a second well layer. The well isolation region may include, but is not limited to, a well isolation groove, a well isolation insulating film that fills the well isolation groove, and a diffusion stopper layer disposed under a bottom of the well isolation groove. The first and second well layers have first and second bottoms respectively. The first and second bottoms are deeper in depth than a bottom of the device isolation groove and shallower in depth than the bottom of the well isolation groove.

In another embodiment, a method of forming a semiconductor device may include, but is not limited to, the following processes. A device isolation groove is formed in a semiconductor substrate. The device isolation groove defines an active region of the semiconductor substrate. A device isolation insulating film is formed, which fills the device isolation groove. A well isolation groove is formed in the semiconductor substrate. The well isolation groove is deeper in depth than the device isolation groove. A diffusion stopper layer is formed under a bottom of the well isolation groove. A well isolation insulating film is formed, which fills the well isolation groove. First and second well layers are selectively formed in the active region of the semiconductor substrate. The first and second well layers have first and second bottoms respectively. The first and second bottoms are deeper in depth than a bottom of the device isolation groove and shallower in depth than the bottom of the well isolation groove.

In still another embodiment, a method of forming a semiconductor device may include, but is not limited to, the following processes. A well isolation groove is formed in a semiconductor substrate. A diffusion stopper layer is formed under a bottom of the well isolation groove. A well isolation insulating film is formed, which fills the well isolation groove. A device isolation groove is formed in the semiconductor substrate. The device isolation groove defines an active region of the semiconductor substrate. The device isolation groove is shallower in depth than the well isolation groove. A device isolation insulating film is formed, which fills the device isolation groove. First and second well layers are selectively formed in the active region of the semiconductor substrate. The first and second well layers have first and second bottoms respectively. The first and second bottoms are deeper in depth than a bottom of the device isolation groove and shallower in depth than the bottom of the well isolation groove.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 18, 19, 20, 21, 22A and 22B, in order to facilitate the understanding of the present invention. FIGS. 18, 19, 20, 21, 22A and 22B illustrate sequential steps involved in a method of forming a semiconductor device having a well isolation region with a wider width in a related art.

Figure 18:
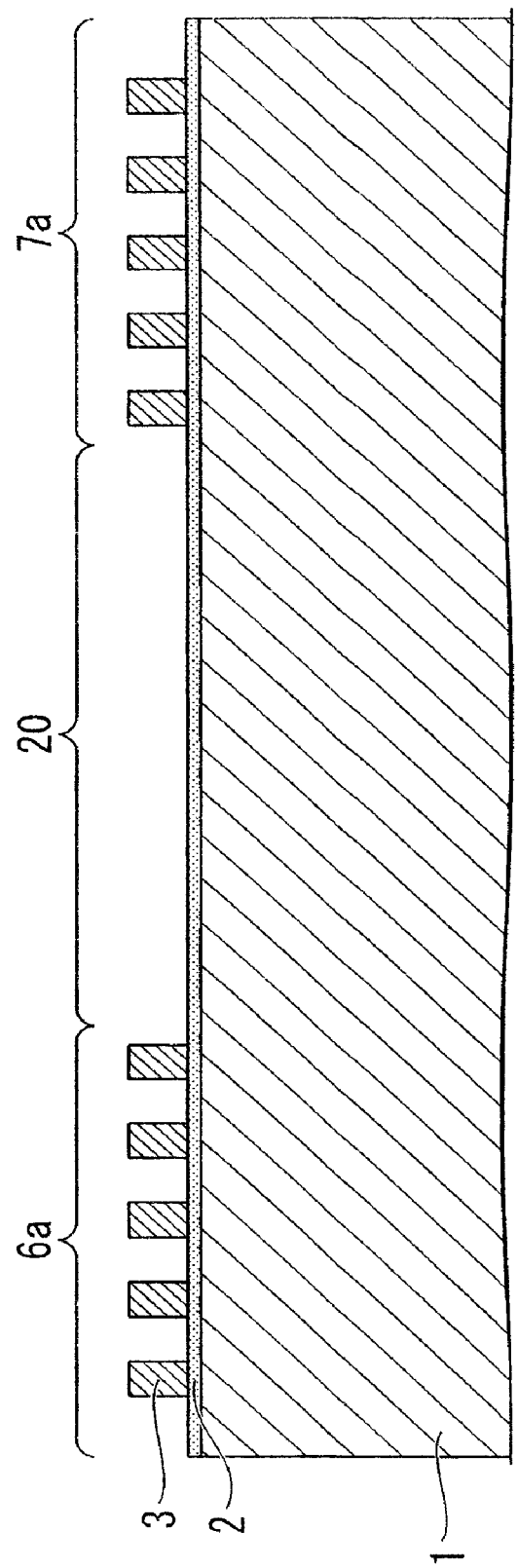
FIG. 18 is a fragmentary cross sectional elevation view illustrating a step involved in the method of forming the semiconductor device having a well isolation region with a wider width which is shallower than well layers or diffusion layers in the related art.

With reference to FIG. 18, a silicon oxide film 2 is formed on a surface of the silicon substrate 1. A silicon nitride film 3 is formed over the silicon oxide film 2. A photo-lithography process and a dry etching process are carried out to pattern the silicon nitride film 3 thereby forming silicon nitride patterns 3. The silicon nitride patterns 3 define a p-well region 6a, an n-well region 7a and a well isolation region 20. The well isolation region 20 is disposed between the p-well region 6a and the n-well region 7a. The well isolation region 20 separates the p-well region 6a and the n-well region 7a from each other. The silicon nitride patterns 3 are present over the p-well region 6a and the n-well region 7a. The silicon nitride patterns 3 are absent over the well isolation region 20.

Figure 19:
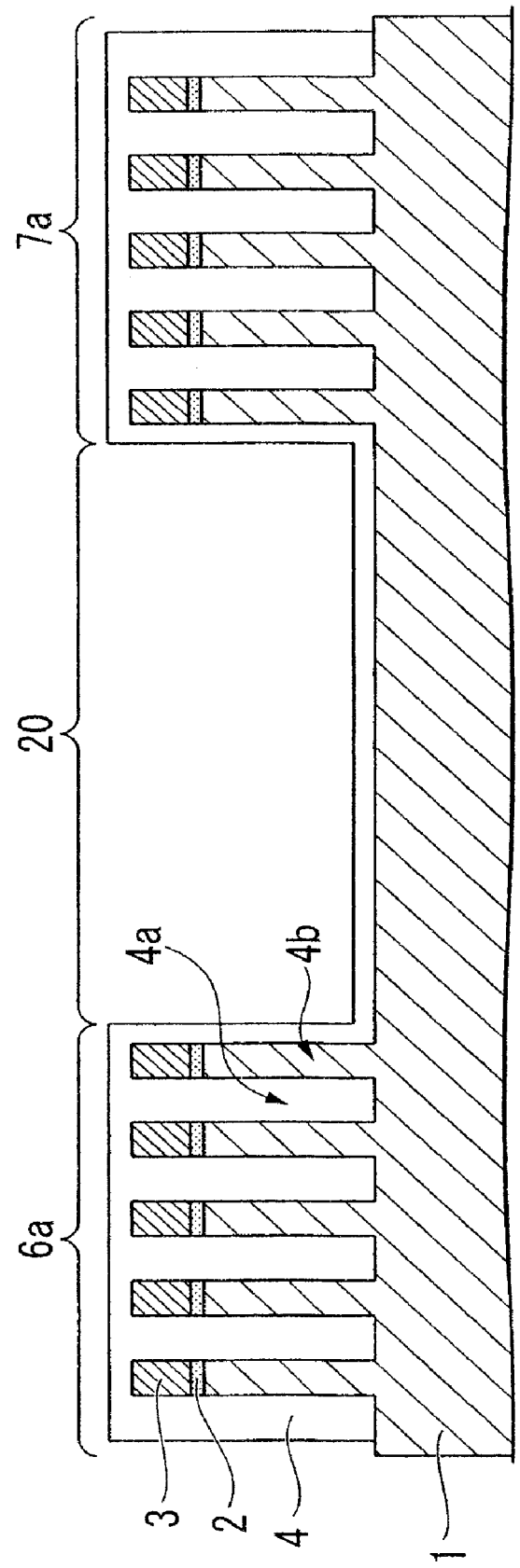
FIG. 19 is a fragmentary cross sectional elevation view illustrating a step subsequent to the step of FIG. 18, involved in the method of forming the semiconductor device in the related art.

With reference to FIG. 19, a dry etching process is carried out using the silicon nitride patterns 3 as a mask to selectively etch the silicon oxide film 2 and the silicon substrate 1, thereby forming device isolation grooves 4a. The p-well region 6a and the n-well region 7a have the combed device isolation grooves 4a. The combed device isolation grooves 4a define the combed shape of vertical section of active regions 4b of the silicon substrate 1. The well isolation region 20 has the wide isolation groove 4a. A device isolation oxide film 4 is formed entirely so that the device isolation oxide film 4 fills up the combed device isolation grooves 4a and also extends along the bottom and side walls of the wide isolation groove 4a. The combed active regions 4b are separated from each other by the device isolation oxide film 4.

Figure 20:
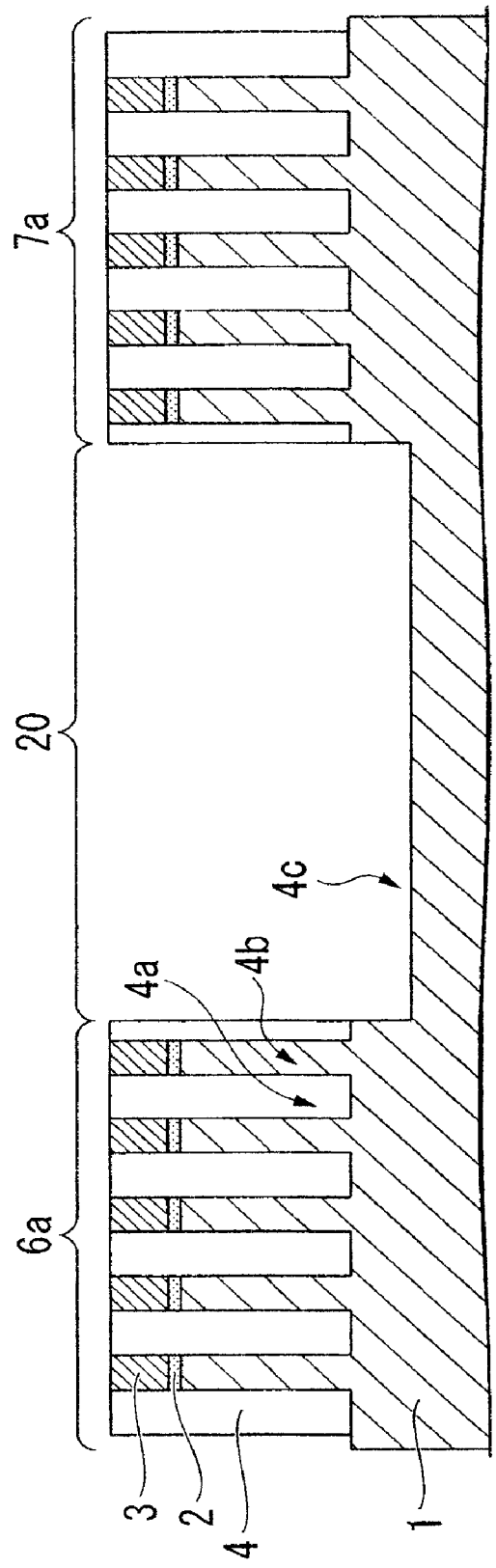
FIG. 20 is a fragmentary cross sectional elevation view illustrating a step subsequent to the step of FIG. 19, involved in the method of forming the semiconductor device in the related art.

With reference to FIG. 20, a dry etching process is carried out to etch back the device isolation oxide film 4 until the top surfaces of the silicon nitride patterns 3 are shown. The device isolation oxide film 4 is removed from the wide isolation groove 4c, while leaving The device isolation oxide film 4 to fill up the combed device isolation grooves 4a and to separate the combed active regions 4b from each other. As a result, a deeper and wide isolation groove 4c is formed in the well isolation region 20 of the silicon substrate 1. The device isolation oxide film 4 fills up the combed device isolation grooves 4a and separates the combed active regions 4b from each other.

Figure 21:
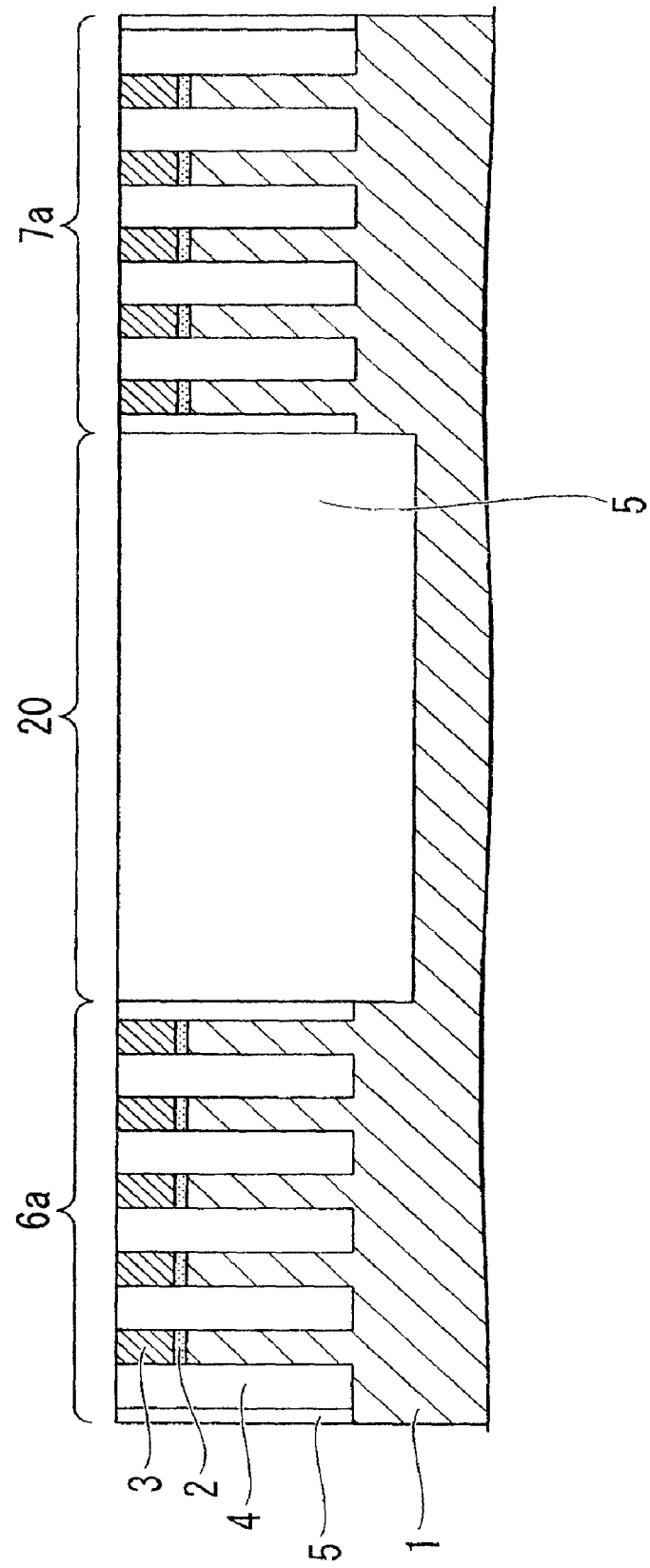
FIG. 21 is a fragmentary cross sectional elevation view illustrating a step subsequent to the step of FIG. 20, involved in the method of forming the semiconductor device in the related art.

With reference to FIG. 21, a silicon oxide film 5 is formed entirely over the well isolation region 20 and the p-well region 6a and the n-well region 7a. The silicon oxide film 5 fills up the well isolation region 20 and the silicon oxide film 5 extends over the silicon nitride patterns 3. A chemical mechanical polishing process is carried out to planarize the silicon oxide film 5 so as to leave the silicon oxide film 5 fills up the well isolation region 20, while the silicon oxide film 5 is absent in the p-well region 6a and the n-well region 7a. The silicon oxide film 5 in the well isolation region 20 performs as a well isolation oxide film 5. The well isolation oxide film 5 separates the p-well region 6a and the n-well region 7a from each other.

Figure 22A:
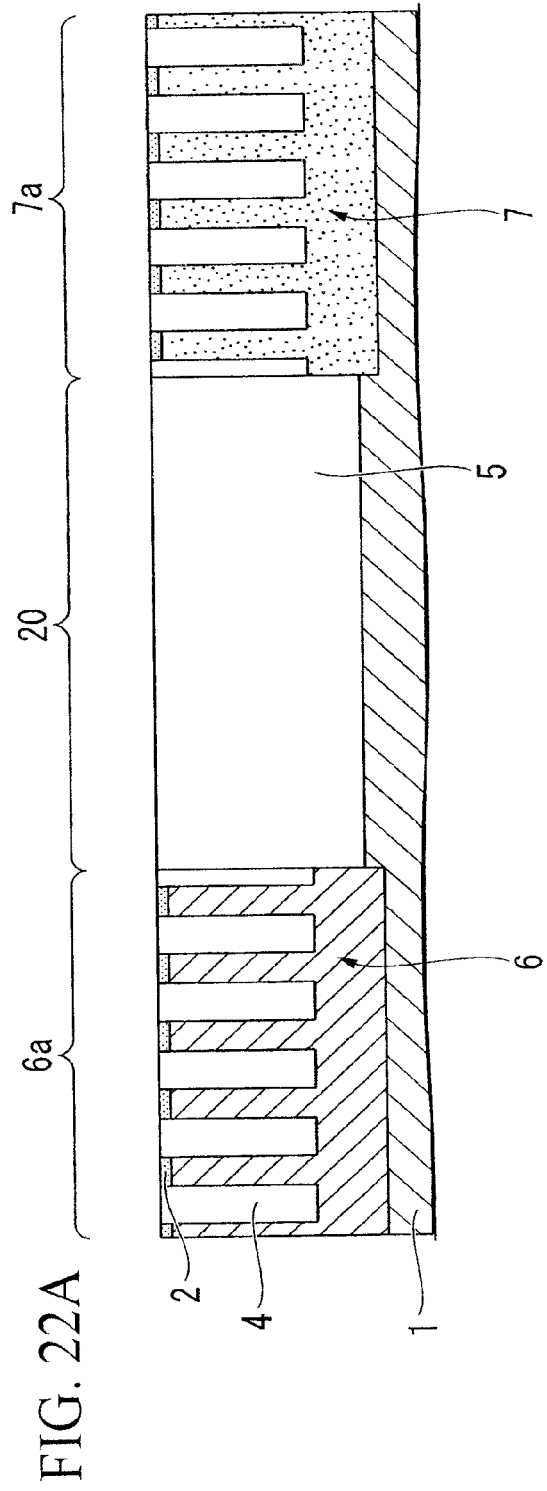
FIG. 22A is a fragmentary cross sectional elevation view illustrating a step subsequent to the step of FIG. 21, involved in the method of forming the semiconductor device in the related art.

With reference to FIG. 22A, a photo-lithography process is carried out to form a photo-resist mask that covers the well isolation region 20 and the n-well region 7a. Boron ions are implanted into the p-well region 6a, while the photo-resist mask covers the well isolation region 20 and the n-well region 7a, thereby selectively forming a p-well layer 6 in the p-well region 6a. The photo-resist mask as used for forming the p-well layer 6 is removed. Another photo-lithography process is carried out to form another photo-resist mask that covers the well isolation region 20 and the p-well region 6a. Phosphorus ions are implanted into the n-well region 7a, while the photo-resist mask covers the well isolation region 20 and the p-well region 6a, thereby selectively forming an n-well layer 7 in the n-well region 7a. The p-well layer 6 has the bottom that is deeper than the bottom of the well isolation oxide film 5. The n-well layer 7 has the bottom that is deeper than the bottom of the well isolation oxide film 5.

Figure 22B:
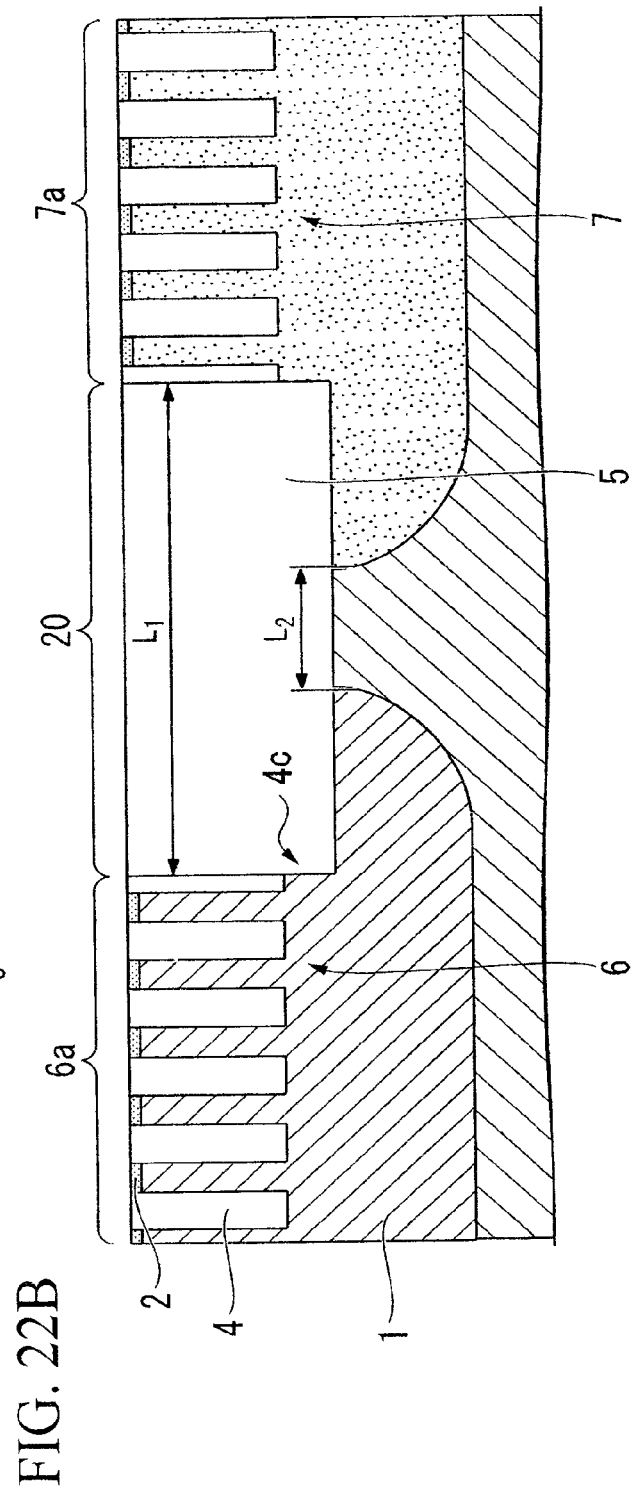
FIG. 22B is a fragmentary cross sectional elevation view illustrating a step subsequent to the step of FIG. 22A, involved in the method of forming the semiconductor device in the related art.

With reference to FIG. 22B, a heat treatment is carried out to activate the ions implanted in the p-well layer 6 and the n-well layer 7, while causing thermal-diffusion of the implanted ions. The thermal-diffusion of the implanted ions causes that the p-well layer 6 and the n-well layer 7 are diffused downwardly and horizontally, so that the bottoms of the p-well layer 6 and the n-well layer 7 go deeper and parts of the p-well layer 6 and the n-well layer 7 expand to under the well isolation oxide film 5. The thermal-diffusion of the implanted ions causes that the distance between the p-well layer 6 and the n-well layer 7 becomes narrower, for example, with the distance decreasing from $L_1$ to $L_2$, wherein $L_1 > L_2$, wherein the distance $L_1$ is the dimension in the horizontal direction of the well isolation oxide film 5, and the distance $L_2$ is the distance between the p-well layer 6 and the n-well layer 7. The distance $L_2$ is the effective width of isolation between the p-well layer 6 and the n-well layer 7 even the well isolation oxide film 5 has the wide width $L_1$. Decrease in the distance between the p-well layer 6 and the n-well layer 7 will deteriorate the well isolation characteristics.

In some cases, the diffused portions of the p-well layer 6 and the n-well layer 7 may come closer to each other. In worst cases, the diffused portions of the p-well layer 6 and the n-well layer 7 contact with each other or partially overlap each other, thereby reducing the junction voltage and causing latch-up. Remarkable reduction in the junction voltage and/or latch up may result in that the semiconductor device is no longer operable with the required performances. The width $L_1$ of the well isolation oxide film 5 needs to be wider sufficiently in order to avoid that thermal-diffusion causes the distance between the p-well layer 6 and the n-well layer 7 to be so narrow as the semiconductor device is no longer operable with the required performances. Sufficiently wider width $L_1$ of the well isolation oxide film 5 or the well isolation region 20 would make it difficult to realize high density integration of the semiconductor device.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 3:
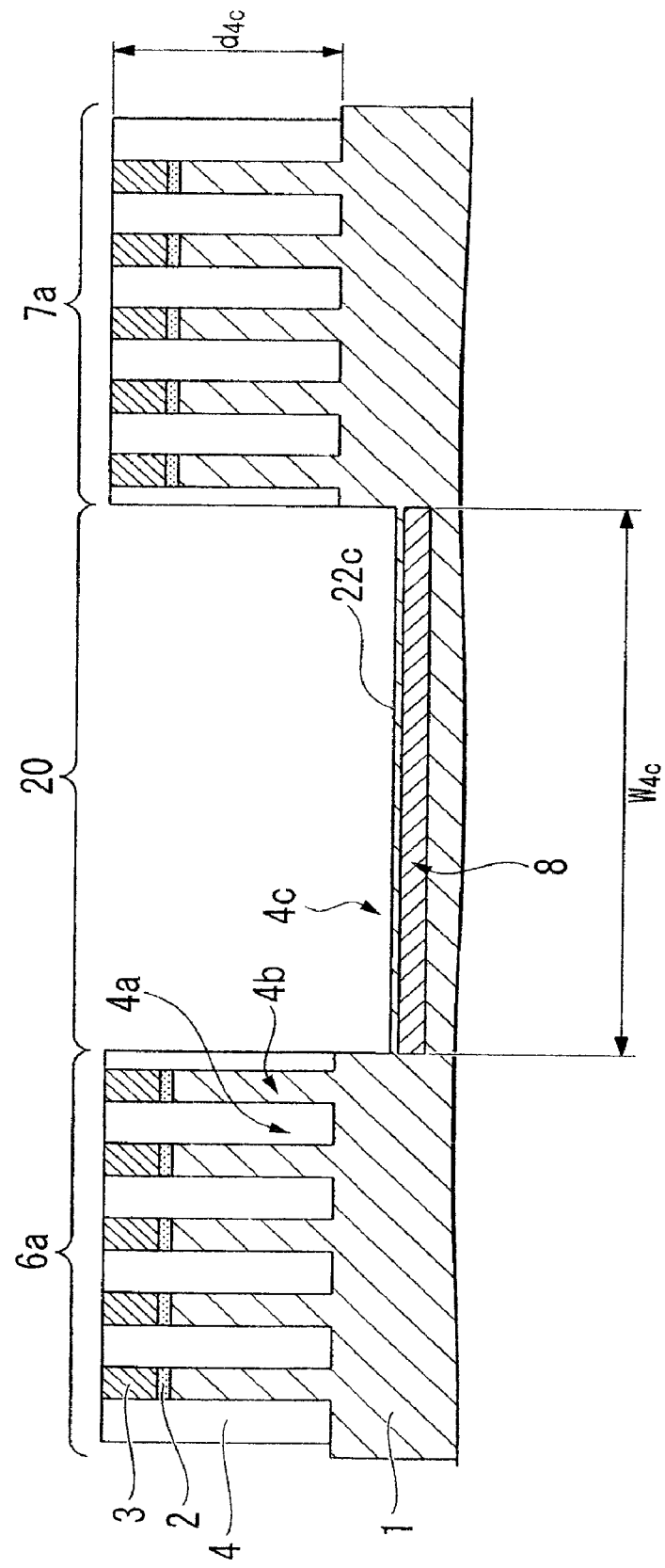
FIG. 3 is a fragmentary cross sectional elevation view illustrating a step subsequent to the step of FIG. 2, involved in the method of forming the semiconductor device in accordance with the first preferred embodiment of the present invention.
Figure 4:
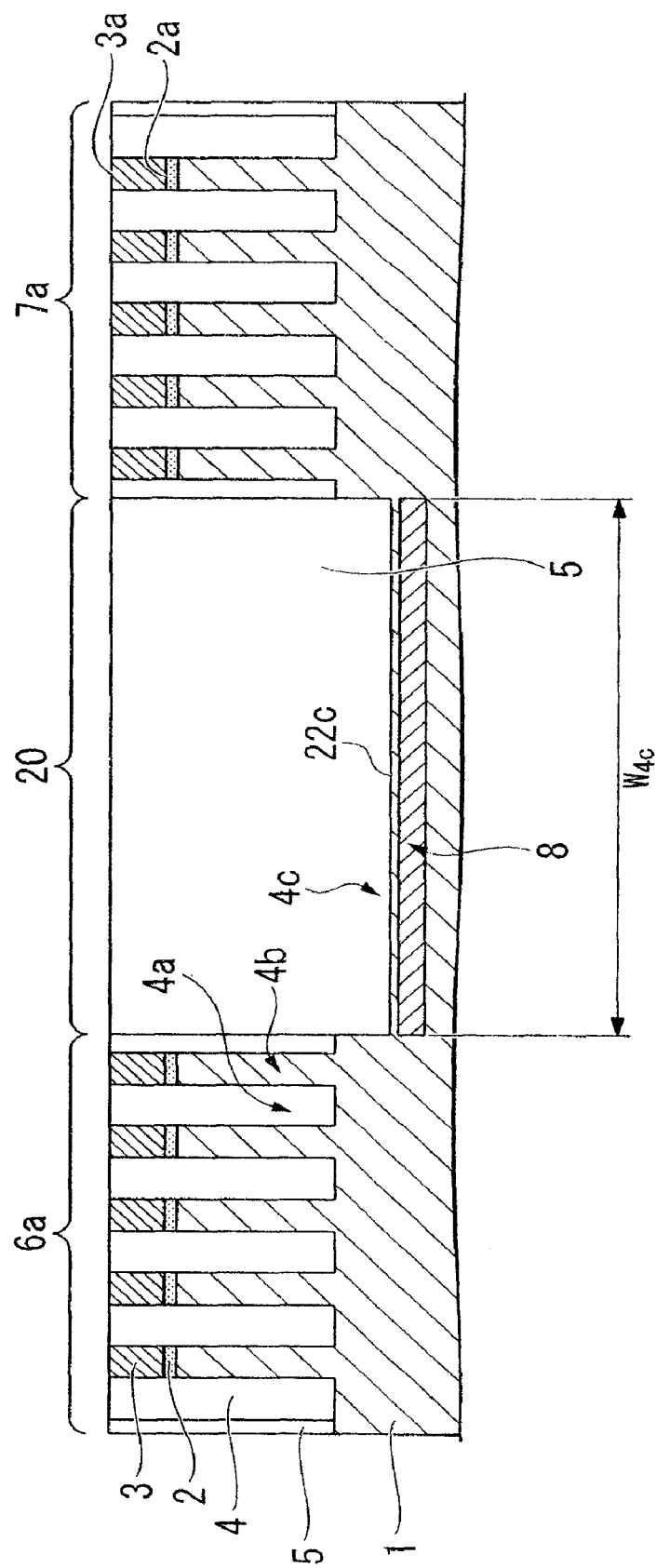
FIG. 4 is a fragmentary cross sectional elevation view illustrating a step subsequent to the step of FIG. 3, involved in the method of forming the semiconductor device in accordance with the first preferred embodiment of the present invention.
Figure 5:
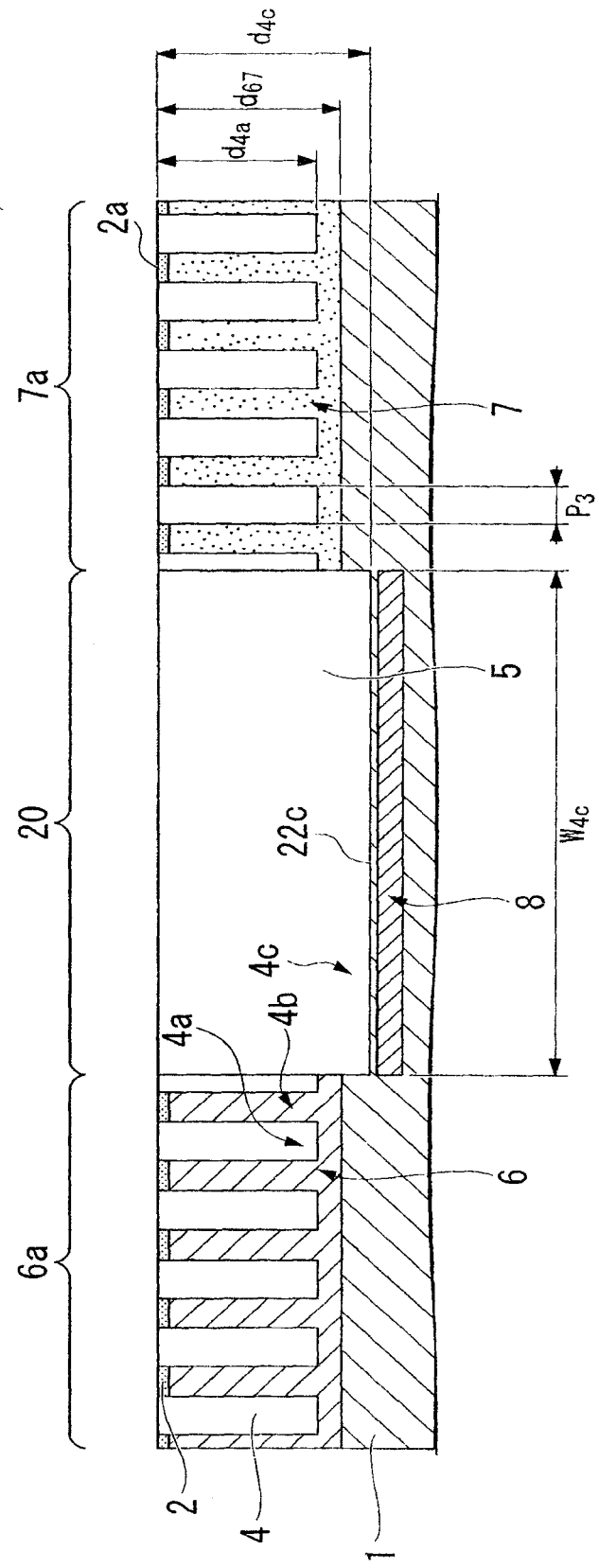
FIG. 5 is a fragmentary cross sectional elevation view illustrating a step subsequent to the step of FIG. 4, involved in the method of forming the semiconductor device in accordance with the first preferred embodiment of the present invention.

FIGS. 1 through 5 illustrate sequential steps involved in a method of forming a semiconductor device having a well isolation region with a narrower width in accordance with a first preferred embodiment of the present invention. FIG. 5 illustrates the semiconductor device having the well isolation region with the narrower width in accordance with the first preferred embodiment of the present invention.

A semiconductor device 101 may include, but is not limited to, a semiconductor substrate 1, a p-well region 6a, an n-well region 7a and a well isolation region 20. The p-well region 6a, the n-well region 7a and the well isolation region 20 are disposed over the semiconductor substrate 1. The well isolation region 20 is disposed between the p-well region 6a and the n-well region 7a. The well isolation region 20 separates the p-well region 6a and the n-well region 7a from each other.

The p-well region 6a and the n-well region 7a have combed device isolation grooves 4a. The combed device isolation grooves 4a define the combed shape of vertical section of active regions 4b of the silicon substrate 1. The well isolation region 20 has the wide isolation groove 4a. The p-well region 6a and the n-well region 7a have isolation oxide film 4. The device isolation oxide film 4 fills up the combed device isolation grooves 4a. The device isolation oxide film 4 separates the combed active regions 4b from each other.

The well isolation region 20 has an isolation groove 4c that is positioned between the p-well region 6a and the n-well region 7a. The well isolation groove 4c separates the p-well region 6a and the n-well region 7a from each other. The well isolation groove 4c has a bottom 22c. The well isolation region 20 has a well isolation oxide film 5 that fills up the well isolation groove 4c. The well isolation oxide film 5 separates the p-well region 6a and the n-well region 7a from each other. The well isolation oxide film 5 has the bottom that is defined by the bottom 22c of the well isolation groove 4c. The well isolation region 20 has a diffusion stopper layer 8. The diffusion stopper layer 8 extends under the bottom 22c of the well isolation groove 4c. Namely, the diffusion stopper layer 8 extends under the bottom of the well isolation oxide film 5. The diffusion stopper layer 8 contains elements that allow the diffusion stopper layer 8 to perform as a diffusion stopper.

The p-well region 6a has a p-well layer 6. The n-well region 7a has an n-well layer 7. The p-well layer 6 contains p-type dopant. The n-well layer 7 contains n-type dopant. The p-well layer 6 has the bottom that is shallower than the bottom of the well isolation oxide film 5. The p-well layer 6 has the bottom that is shallower than the bottom 22c of the well isolation groove 4c. The n-well layer 7 has the bottom that is shallower than the bottom of the well isolation oxide film 5. The n-well layer 7 has the bottom that is shallower than the bottom 22c of the well isolation groove 4c. The p-well layer 6 and the n-well layer 7 have a depth $d_{67}$ from the surface 2a. The well isolation groove 4c and the well isolation oxide film 5 have a depth $d_{4c}$ from the surface 2a. The combed active regions 4b have a depth $d_{4a}$ from the surface 2a. The depth $d_{67}$ of the p-well layer 6 and the n-well layer 7 is shallower than the depth $d_{4c}$ of the well isolation groove 4c and the well isolation oxide film 5. The depth $d_{67}$ of the p-well layer 6 and the n-well layer 7 is deeper than the depth $d_{4a}$ of the combed active regions 4b.

These relationships of the depths can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. These relationships of the depths can effectively prevent that a thermal-diffusion of the ions introduced in the p-well layer 6 and the n-well layer 7 causes, in worst cases, the diffused portions of the p-well layer 6 and the n-well layer 7 to contact with each other under the well isolation oxide film 5 or to partially overlap each other under the well isolation oxide film 5, thereby reducing the junction voltage and causing latch-up.

The above relationships of the depths can effectively prevent remarkable reduction in the junction voltage and/or latch up, and can ensure that the semiconductor device is operable with the required performances. The width $W_{4c}$ of the well isolation oxide film 5 may have a necessary minimum width to avoid that a thermal-diffusion causes the distance between the p-well layer 6 and the n-well layer 7 to be as narrow as the semiconductor device is no longer operable with the required performances. The necessary minimum width $W_{4c}$ of the well isolation oxide film 5 or the well isolation region 20 would be effective to realize high density integration of the semiconductor device.

The diffusion stopper layer 8 can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. The diffusion stopper layer 8 can effectively prevent that a thermal-diffusion of the ions introduced in the p-well layer 6 and the n-well layer 7 causes, in worst cases, the diffused portions of the p-well layer 6 and the n-well layer 7 to contact with each other under the well isolation oxide film 5 or to partially overlap each other under the well isolation oxide film 5, thereby reducing the junction voltage and causing latch-up.

The diffusion stopper layer 8 can effectively prevent remarkable reduction in the junction voltage and/or latch up, and can ensure that the semiconductor device is operable with the required performances. The diffusion stopper layer 8 can reduce the necessary minimum width as the width $W_{4c}$ of the well isolation oxide film 5, wherein the necessary minimum width needs to avoid that a thermal-diffusion causes the distance between the p-well layer 6 and the n-well layer 7 to be as narrow as the semiconductor device is no longer operable with the required performances. Further reduction of the necessary minimum width $W_{4c}$ of the well isolation oxide film 5 or the well isolation region 20 would be effective to realize high density integration of the semiconductor device.

In some cases, the diffusion stopper layer 8 can be realized by a semiconductor layer that is introduced with elements that can prevent the impurity diffusion. A typical example of the diffusion stopper elements introduced into the diffusion stopper layer 8 may preferably include one or more of carbon, nitrogen, fluorine and germanium. Those elements may inhibit diffusion of a p-type impurity implanted into the p-well layer 6 and also diffusion of an n-type impurity implanted into the n-well layer 7. The diffusion stopper layer 8 extends under the bottom 22c of the well isolation groove 4c. Namely, the diffusion stopper layer 8 extends under the bottom of the well isolation oxide film 5. The diffusion stopper layer 8 inhibits the thermal diffusions of the p-type impurity in the p-well layer 6 and the thermal diffusions of the n-type impurity in the n-well layer 7. The diffusion stopper layer 8 can ensure isolation between the p-well layer 6 and the n-well layer 7.

In some cases, the concentration of the diffusion stopper elements in the diffusion stopper layer 8 may be approximately similar to the concentrations of the p-type impurity and n-type impurity in the p-well layer 6 and the n-well layer 7, so that the diffusion stopper layer 8 has an enhanced effect of inhibiting the impurity diffusion.

As described above with reference to FIG. 5, the depth $d_{67}$ of the p-well layer 6 and the n-well layer 7 is shallower than the depth $d_{4c}$ of the well isolation groove 4c and the well isolation oxide film 5. The depth $d_{67}$ of the p-well layer 6 and the n-well layer 7 is deeper than the depth $d_{4a}$ of the combed active regions 4b.

These relationships of the depths can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. These relationships of the depths can effectively prevent that a thermal-diffusion of the ions introduced in the p-well layer 6 and the n-well layer 7 causes, in worst cases, the diffused portions of the p-well layer 6 and the n-well layer 7 to contact with each other or to partially overlap each other under the well isolation oxide film 5.

The above relationships of the depths can reduce the necessary minimum width $W_{4c}$ of the well isolation oxide film 5, while ensuring the isolation between the p-well layer 6 and the n-well layer 7. The necessary minimum width $W_{4c}$ is a width to avoid that a thermal-diffusion causes the distance between the p-well layer 6 and the n-well layer 7 to be as narrow as the semiconductor device is no longer operable with the required performances. The necessary minimum width $W_{4c}$ of the well isolation oxide film 5 or the well isolation region 20 would be effective to realize high density integration of the semiconductor device.

The diffusion stopper layer 8 can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. The diffusion stopper layer 8 can effectively prevent that a thermal-diffusion of the ions introduced in the p-well layer 6 and the n-well layer 7 causes, in worst cases, the diffused portions of the p-well layer 6 and the n-well layer 7 to contact with each other or to partially overlap each other under the well isolation oxide film 5.

The diffusion stopper layer 8 can reduce the necessary minimum width as the width $W_{4c}$ of the well isolation oxide film 5 while ensuring the isolation between the p-well layer 6 and the n-well layer 7, wherein the necessary minimum width needs to avoid that a thermal-diffusion causes the distance between the p-well layer 6 and the n-well layer 7 to be as narrow as the semiconductor device is no longer operable with the required performances. Further reduction of the necessary minimum width $W_{4c}$ of the well isolation oxide film 5 or the well isolation region 20 would be effective to realize high density integration of the semiconductor device.

The above relationships of the depths can effectively prevent the semiconductor device 101 from reducing the junction voltage and from causing malfunction such as latch-up, while reducing the necessary minimum width $W_{4c}$ of the well isolation oxide film 5. The diffusion stopper layer 8 can also effectively prevent the semiconductor device 101 from reducing the junction voltage and from causing malfunction such as latch-up, while reducing the necessary minimum width $W_{4c}$ of the well isolation oxide film 5. This can increase the degree of integration of transistors, thereby reducing the manufacturing cost of the semiconductor device.

The diffusion stopper layer 8 is introduced with elements, for example, one or more of carbon, nitrogen, fluorine and germanium that can prevent the impurity diffusion of the p-type impurity in the p-well layer 6 and the n-type impurity in the n-well layer 7. The diffusion stopper layer 8 can ensure the isolation between the p-well layer 6 and the n-well layer 7.

Method of Forming Semiconductor Device:

A typical example of a method of forming a semiconductor device will be described with reference to FIGS. 1 through 5 which illustrate sequential steps involved in a method of forming a semiconductor device having a well isolation region with a narrower width in accordance with the first embodiment of the present invention.

The method of forming the semiconductor device 101 may include, but is not limited to, processes for forming an oxide film and a nitride film, processes for forming a device isolation groove and a device isolation oxide film, processes for forming a well isolation groove and a diffusion stopper layer, a process for forming a well isolation oxide film, and processes for forming p-well layer and n-well layer. The processes for forming an oxide film and a nitride film may include, but are not limited to, forming an oxide film on a surface of a substrate and subsequently forming a nitride film over the oxide film. The processes for forming a device isolation groove and a device isolation oxide film may include, but are not limited to, forming a device isolation groove in the nitride film, the oxide film and the substrate, forming active regions in the substrate, and forming a device isolation oxide film that fills the device isolation groove. The processes for forming a well isolation groove and a diffusion stopper layer may include, but are not limited to, forming a well isolation groove in the in the nitride film, the oxide film and the substrate, introducing diffusion stopper elements into the substrate under the well isolation groove, thereby forming a diffusion stopper layer under the well isolation groove. The process for forming a well isolation oxide film may include, but is not limited to, forming a well isolation oxide film that fills the well isolation groove. The processes for forming p-well layer and n-well layer may include, but are not limited to, selectively introducing a p-type dopant in the active region to form a p-well layer and selectively introducing an n-type dopant in the active region to form an n-well layer, wherein the bottoms of the p-well layer and the n-well layer are deeper than the bottom of the device isolation grooves and shallower than the bottom of the well isolation groove.

(Processes for Forming Oxide Film and Nitride Film)

Figure 1:
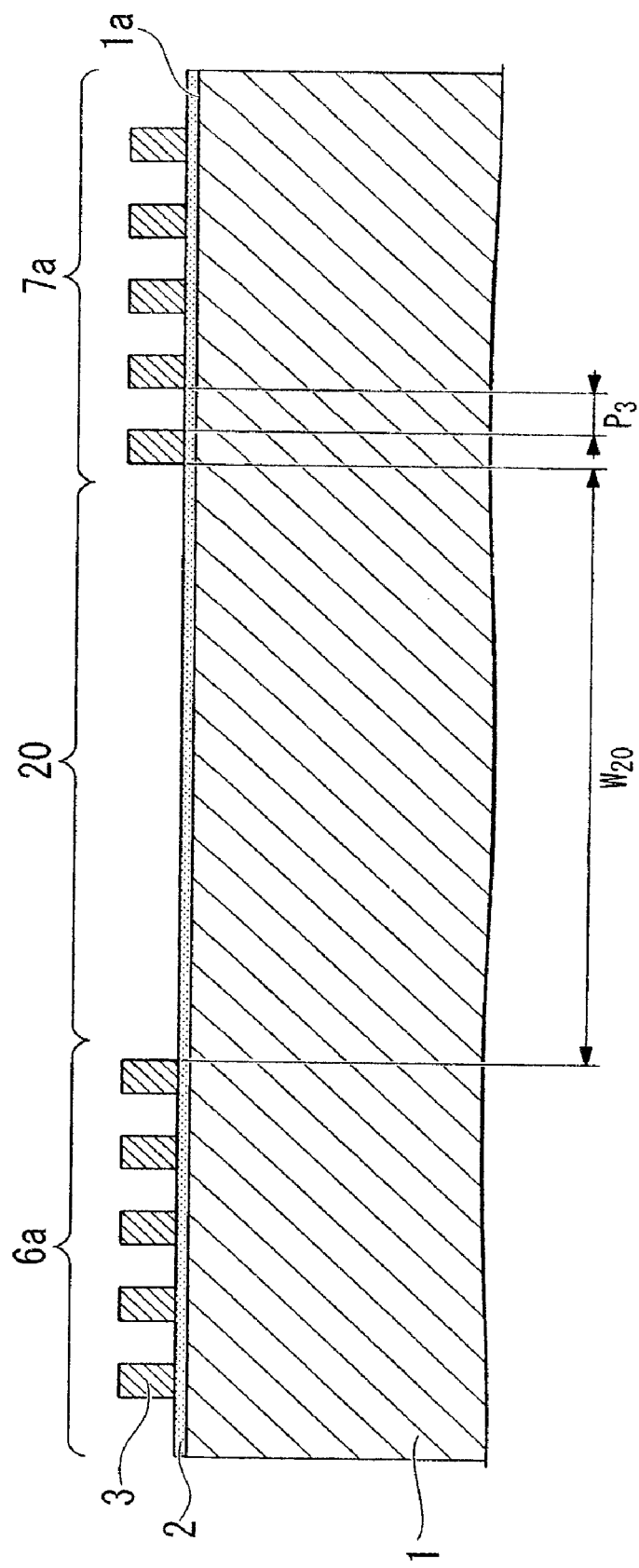
FIG. 1 is a fragmentary cross sectional elevation view illustrating a step involved in a method of forming a semiconductor device having a well isolation region with a narrower width in accordance with a first preferred embodiment of the present invention.

With reference to FIG. 1, a silicon oxide film 2 is formed on a surface 1a of a silicon substrate 1. The silicon oxide film 2 can be formed by a thermal oxidation process. The silicon oxide film 2 may have a thickness of 10 nanometers.

A silicon nitride film 3 is formed over the silicon oxide film 2. The silicon nitride film 3 can be formed by a chemical vapor deposition process. The silicon nitride film 3 may have a thickness of 80 nanometers.

(Processes for Forming Device Isolation Groove and Device Isolation Oxide Film)

A photo-resist film is applied on the silicon nitride film 3. A photo-lithography process is carried out to form a photo-resist pattern on the silicon nitride film 3. A dry etching process is carried out using the photo-resist pattern as a mask, thereby forming silicon nitride patterns 3 in a p-well region 6a and an n-well region 7a. The silicon nitride pattern 3 in each of the p-well region 6a and the n-well region 7a may have a constant pitch $P_3$. The p-well region 6a and the n-well region 7a are separated by a well isolation region 20. The well isolation region 20 separates the p-well region 6a and the n-well region 7a from each other. The silicon nitride pattern 3 are absent in the well isolation region 20. The well isolation region 20 may have a width $W_{20}$. In some cases, the pitch $P_3$ of the silicon nitride pattern 3 may be, but not limited to, 100 nanometers, and the width $W_{20}$ of the well isolation region 20 may be, but not limited to, 300 nanometers.

Figure 2:
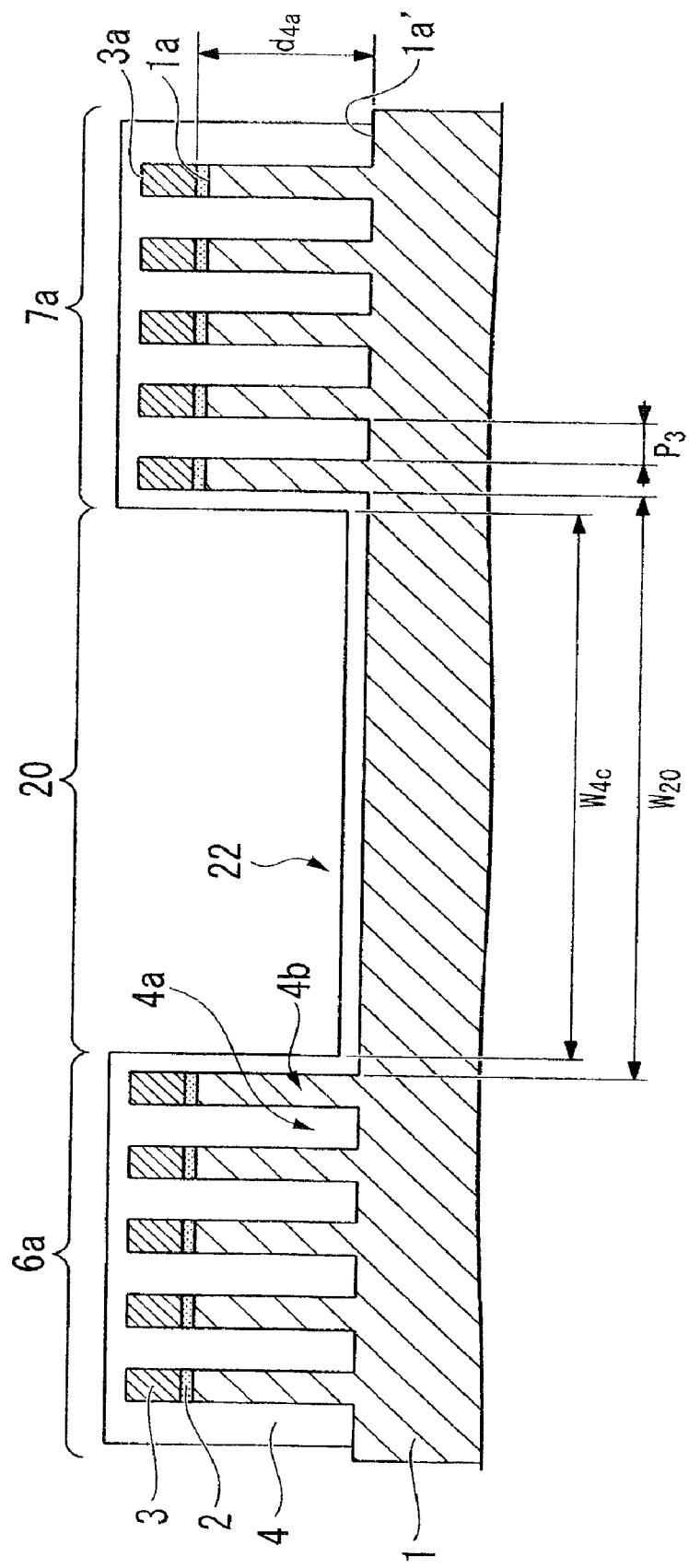
FIG. 2 is a fragmentary cross sectional elevation view illustrating a step subsequent to the step of FIG. 1, involved in the method of forming the semiconductor device in accordance with the first preferred embodiment of the present invention.

With reference to FIG. 2, a dry etching process is carried out using the silicon nitride patterns 3 as a mask to selectively etch the silicon oxide film 2 and the silicon substrate 1, thereby forming device isolation grooves 4a in the p-well region 6a and the n-well region 7a and forming a well isolation groove 22 in the well isolation region 20. The p-well region 6a and the n-well region 7a have the combed device isolation grooves 4a. The combed device isolation grooves 4a define the combed shape of vertical section of active regions 4b of the silicon substrate 1. The combed device isolation grooves 4a have a depth $d_{4a}$ from the bottom level of the silicon nitride patterns 3. The well isolation region 20 has the well isolation groove 22. The well isolation groove 22 has the depth $d_{4a}$ from the bottom level of the silicon nitride patterns 3. The well isolation groove 22 has the same depth as the device isolation grooves 4a. The depth $d_{4a}$ of the well isolation groove 22 and the device isolation grooves 4a may be, but is not limited to, 100 nanometers. The well isolation groove 22 has a width $W_{4c}$ which is slightly smaller than the depth $W_{20}$ of the well isolation region 20. The width $W_{4c}$ of the well isolation groove 22 may be, but is not limited to, slightly smaller than 300 nanometers.

A device isolation oxide film 4 is formed entirely so that the device isolation oxide film 4 covers the silicon nitride patterns 3 as well as fills up the combed device isolation grooves 4a and also extends along the bottom and side walls of the well isolation groove 22. The combed active regions 4b are separated from each other by the device isolation oxide film 4. In some cases, the device isolation oxide film 4 may have a thickness which is greater than one half of the pitch $P_3$ of the silicon nitride pattern 3 and smaller than one half of the width $W_{20}$ of the well isolation groove 22, so that the device isolation oxide film 4 fills up the device isolation grooves 4a, without filling up the well isolation groove 22. When the pitch $P_3$ of the silicon nitride pattern 3 is 100 nanometers and the width $W_{20}$ of the well isolation groove 22 is 300 nanometers, the thickness of the device isolation oxide film 4 may be greater than 50 nanometers and smaller than 150 nanometers. In one example, the thickness of the device isolation oxide film 4 may be, but is not limited to, 70 nanometers. The device isolation oxide film 4 fills up the device isolation grooves 4a, without filling up the well isolation groove 22. The device isolation oxide film 4 may have a necessary minimum thickness to fill up the device isolation grooves 4a, without filling up the well isolation groove 22. The necessary minimum thickness of the device isolation oxide film 4 minimizes the amount of the device isolation oxide film 4 to be removed in forming the well isolation groove.

(Processes for Forming Well Isolation Groove and Diffusion Stopper Layer)

With reference to FIG. 3, a dry etching process is carried out to etch back the device isolation oxide film 4 until the top surfaces 3a of the silicon nitride patterns 3 are shown and the surface 1a' of the substrate 1 in the well isolation region 20 are shown. The device isolation oxide film 4 is removed from the top surfaces 3a of the silicon nitride patterns 3 and from the bottom and side walls of the well isolation groove 22. The dry etching process can be carried out utilizing the micro loading effect without using an etching mask, thereby etching, by a certain depth, the surface 1a' of the silicon substrate 1 in the well isolation region 20. The depth by which the surface 1a' of the silicon substrate 1 is etched may be, but is not limited to, 100 nanometers. As a result of the dry etching process, a well isolation groove 4c is formed in the well isolation region 20. The well isolation groove 4c has a depth $d_{4c}$.

It is preferable to utilize the micro loading effect in forming the well isolation groove 4c in the well isolation region 20 without using an etching mask. For realizing the efficient manufacturing process, the process for forming any etching mask and removal process can be omitted by utilizing the micro loading effect. The micro loading effect is a phenomenon that the etching rate depends upon the density of patterns over the substrate or wafer. The etching rate is slower at the higher density of patterns, and is faster at the lower density of patterns. The p-well region 6a and the n-well region 7a have a higher density of patterns of the combed active regions 4b. The well isolation region 20 is free of the combed active regions 4b. Thus, the well isolation region 20 has a lower density of patterns. The etching rate of the silicon oxide film 4 in the well isolation region 20 is significantly higher than the etching rate of the silicon oxide film 4 in the p-well region 6a and the n-well region 7a, so that the silicon oxide film 4 in the well isolation region 20 is etched at the higher etching rate, while the silicon oxide film 4 in the p-well region 6a and the n-well region 7a is etched at the lower etching rate. The well isolation groove 4c in the well isolation region 20 is deeper than the device isolation grooves 4a in the p-well region 6a and the n-well region 7a. Utilizing the micro loading effect makes it possible to efficiently form the well isolation groove 4c in the well isolation region 20 without using an etching mask, wherein the well isolation groove 4c is deeper than the device isolation grooves 4a in the p-well region 6a and the n-well region 7a. The well isolation groove 4c has the bottom surface 22c that is defined by the surface of the silicon substrate 1.

An ion-implantation process can be carried out to selectively introduce diffusion stopper elements into the silicon substrate 1 under the well isolation groove 4c in the well isolation region 20, thereby forming a diffusion stopper layer 8. The diffusion stopper layer 8 extends under the bottom surface 22c of the well isolation groove 4c.

The ion-implantation process can be carried out, but not limited to, conditions of acceleration energy of 20 keV and at a dose of 1E15/cm². Carbon can be selected as the diffusion stopper element to be introduced by the ion-implantation process. It is also possible to select nitrogen, fluorine and germanium solely or in combination thereof.

(Process for Forming Well Isolation Oxide Film)

With reference to FIG. 4, a high density plasma process is carried out to form a well isolation oxide film 5 entirely so that the well isolation oxide film 5 covers the p-well region 6a and the n-well region 7a and fills up the well isolation groove 4c in the well isolation region 20. The thickness of the well isolation oxide film 5 may be, but is not limited to, 300 nanometers.

A chemical mechanical polishing process can be carried out to planarize the well isolation oxide film 5, so that the well isolation oxide film 5 remains filling up the well isolation groove 4c in the well isolation region 20, while the top surfaces 3a of the silicon nitride patterns 3 are shown in the p-well region 6a and the n-well region 7a. The well isolation oxide film 5 with the planarized surface is formed, which fills up the well isolation groove 4c in the well isolation region 20.

(Processes for Forming P-Well Layer and N-Well Layer)

A wet etching process is carried out to selectively etch the well isolation oxide film 5 and the silicon oxide film 4 by the same depth as the silicon nitride patterns 3, so that the top surfaces of the surface-etched silicon oxide film 4 are substantially the same level as the bottom level of the silicon nitride patterns 3. Another wet etching process is carried out to remove the silicon nitride patterns 3, so that the top surfaces 2a of the silicon oxide films 2 are shown.

A photo-resist film is applied on the silicon oxide films 2, the silicon oxide film 4, and the well isolation oxide film 5. A photo-lithography process is carried out to form a photo-resist pattern that covers the well isolation region 20 and the n-well region 7a. Boron ions are implanted into the p-well region 6a, while the photo-resist mask covers the well isolation region 20 and the n-well region 7a, thereby selectively forming a p-well layer 6 in the p-well region 6a. The photo-resist mask as used for forming the p-well layer 6 is removed. The p-well layer 6 has the bottom that is shallower than the bottom of the well isolation oxide film 5. The p-well layer 6 has the bottom that is shallower than the bottom 22c of the well isolation groove 4c. The p-well layer 6 has a depth $d_{67}$ from the surface 2a. The depth $d_{67}$ of the p-well layer 6 is shallower than the depth $d_{4c}$ of the well isolation groove 4c and the well isolation oxide film 5. The depth $d_{67}$ of the p-well layer 6 is deeper than the depth $d_{4a}$ of the device isolation grooves 4a.

Another photo-lithography process is carried out to form another photo-resist mask that covers the well isolation region 20 and the p-well region 6a. Phosphorus ions are implanted into the n-well region 7a, while the photo-resist mask covers the well isolation region 20 and the p-well region 6a, thereby selectively forming an n-well layer 7 in the n-well region 7a. The n-well layer 7 has the bottom that is shallower than the bottom of the well isolation oxide film 5. The n-well layer 7 has the bottom that is shallower than the bottom 22c of the well isolation groove 4c. The n-well layer 7 has the depth $d_{67}$ from the surface 2a. The depth $d_{67}$ of the n-well layer 7 is shallower than the depth $d_{4c}$ of the well isolation groove 4c and the well isolation oxide film 5. The depth $d_{67}$ of the n-well layer 7 is deeper than the depth $d_{4a}$ of the device isolation grooves 4a.

It is also possible that the n-well layer 7 is formed before the p-well layer 6 is formed.

Other processes for forming the p-well layer 6 and the n-well layer 7 than those described above may be available. In some cases, p-type ions are entirely introduced and then n-type ions are selectively introduced into the n-well region 7a. In other cases, n-type ions are entirely introduced and then p-type ions are selectively introduced into the p-well region 6a. In any processes described above, the p-well layer 6 and the n-well layer 7 can be formed easily.

The p-well layer 6, the n-well layer 7, and the diffusion stopper layer 8 can be formed as described above. As a result of those processes described above with reference to FIGS. 1 through 5, the semiconductor device 101 shown in FIG. 5 is formed.

The above described processes forms the well isolation groove 4c having the bottom 22c which has the depth $d_{4c}$ which is deeper than the depth $d_{67}$ of the p-well layer 6 and the n-well layer 7 which is deeper than the depth $d_{4c}$ of the well isolation groove 22. The diffusion stopper element is selectively introduced into the substrate 1 under the bottom 22c of the well isolation groove 4c in the well isolation region 20, thereby forming the diffusion stopper layer 8 which extends under the bottom 22c of the well isolation groove 4c. No diffusion stopper element is introduced into the p-well region 6a and the n-well region 7a, in order to avoid any deterioration of the performances of the semiconductor device 101. Selective introduction of the diffusion stopper element into the substrate 1 under the bottom 22c of the well isolation groove 4c without introducing the diffusion stopper element into the p-well region 6a and the n-well region 7a can prevent that the leakage of current $I_{off}$ is increased.

The micro loading effect is utilized to form the well isolation groove 4c in the well isolation region 20 without using an etching mask, thereby realizing the efficient process for forming the well isolation groove 4c and realizing the manufacturing process.

Second Embodiment

Figure 9:
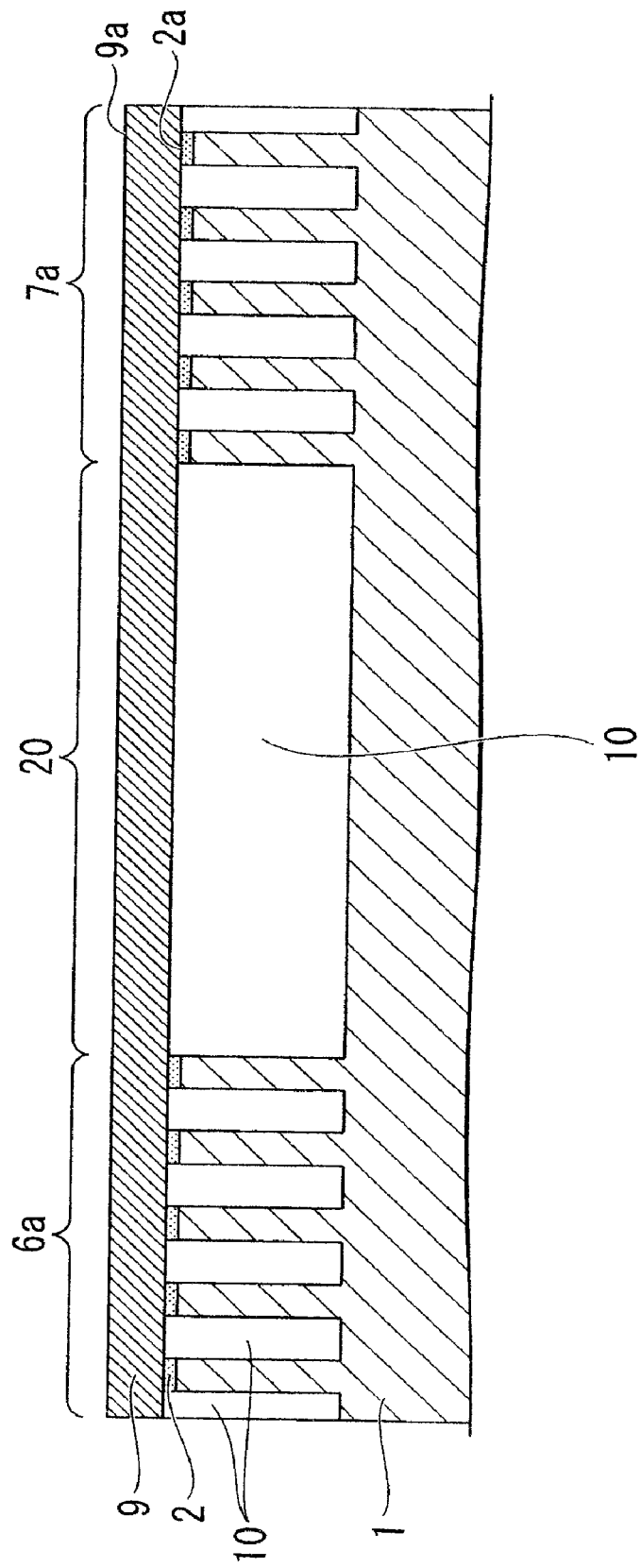
FIG. 9 is a fragmentary cross sectional elevation view illustrating a step subsequent to the step of FIG. 8, involved in the method of forming the semiconductor device in accordance with the second preferred embodiment of the present invention.
Figure 10:
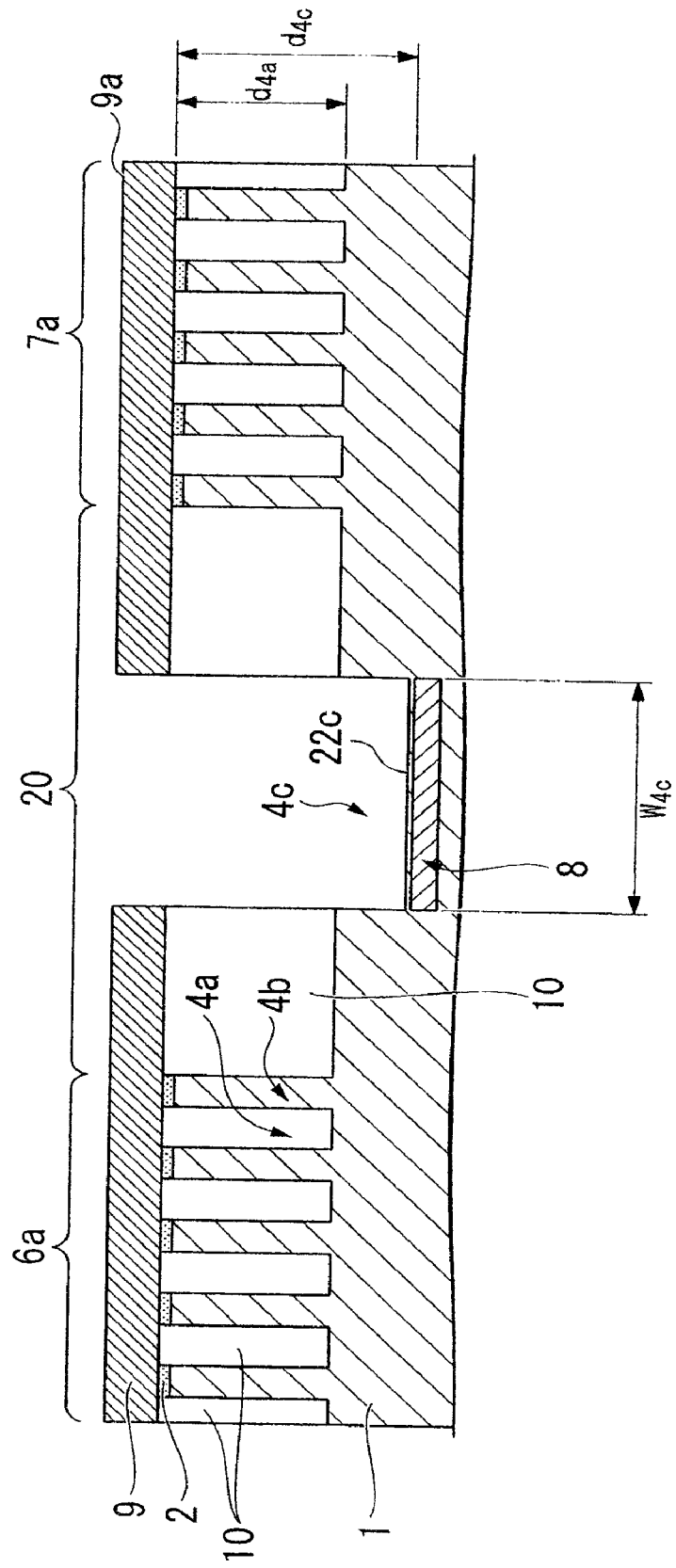
FIG. 10 is a fragmentary cross sectional elevation view illustrating a step subsequent to the step of FIG. 9, involved in the method of forming the semiconductor device in accordance with the second preferred embodiment of the present invention.
Figure 11:
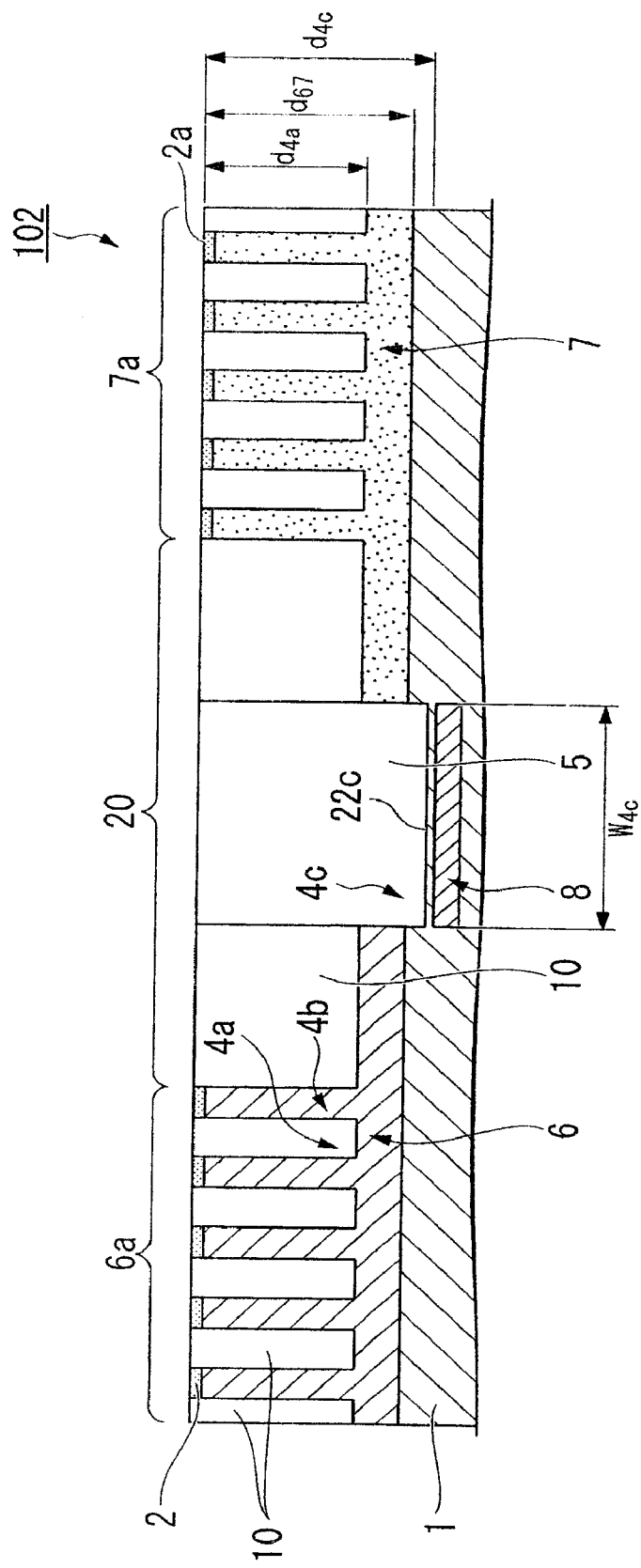
FIG. 11 is a fragmentary cross sectional elevation view illustrating a step subsequent to the step of FIG. 10, involved in the method of forming the semiconductor device in accordance with the second preferred embodiment of the present invention.

FIGS. 6 through 11 illustrate sequential steps involved in a method of forming a semiconductor device having a well isolation region with a narrower width in accordance with a second preferred embodiment of the present invention. FIG. 11 illustrates the semiconductor device having the well isolation region with the narrower width in accordance with the second preferred embodiment of the present invention.

A semiconductor device 102 may include, but is not limited to, a semiconductor substrate 1, a p-well region 6a, an n-well region 7a and a well isolation region 20. The p-well region 6a, the n-well region 7a and the well isolation region 20 are disposed over the semiconductor substrate 1. The well isolation region 20 is disposed between the p-well region 6a and the n-well region 7a. The well isolation region 20 separates the p-well region 6a and the n-well region 7a from each other.

The semiconductor device 102 is different in the width $W_{4c}$ of the well isolation oxide film 5 from the above-described semiconductor device 101. The well isolation region 20 of the semiconductor device 102 includes the well isolation oxide film 5 and device isolation oxide films 10. The width $W_{4c}$ of the well isolation oxide film 5 is narrower than the width of the well isolation region 20. The device isolation oxide films 10 are positioned between the well isolation oxide film 5 and the p-well and n-well regions 6a and 7a.

The p-well region 6a and the n-well region 7a have combed device isolation grooves 4a. The combed device isolation grooves 4a define the combed shape of vertical section of active regions 4b of the silicon substrate 1. The well isolation region 20 has the wide isolation groove 4a. The p-well region 6a and the n-well region 7a have device isolation oxide film 10. The device isolation oxide film 10 fills up the combed device isolation grooves 4a. The device isolation oxide film 10 separates the combed active regions 4b from each other.

The well isolation region 20 is positioned between the p-well region 6a and the n-well region 7a. The well isolation region 20 has an isolation groove 4c that is positioned between the device isolation oxide films 10. The well isolation groove 4c and the device isolation oxide films 10 in the well isolation region 20 separate the p-well region 6a and the n-well region 7a from each other. The well isolation groove 4c has a bottom 22c. The well isolation region 20 has the well isolation oxide film 5 that fills up the well isolation groove 4c. The well isolation oxide film 5 and the device isolation oxide films 10 in the well isolation region 20 separate the p-well region 6a and the n-well region 7a from each other. The well isolation oxide film 5 has the bottom that is defined by the bottom 22c of the well isolation groove 4c. The well isolation region 20 has a diffusion stopper layer 8. The diffusion stopper layer 8 extends under the bottom 22c of the well isolation groove 4c. Namely, the diffusion stopper layer 8 extends under the bottom of the well isolation oxide film 5. The diffusion stopper layer 8 contains elements that allow the diffusion stopper layer 8 to perform as a diffusion stopper.

The p-well region 6a and the well isolation region 20 have a p-well layer 6. The n-well region 7a and the well isolation region 20 have an n-well layer 7. Namely, the p-well layer 6 extends over the p-well region 6a and the well isolation region 20. The n-well layer 7 extends over the n-well region 7a and the well isolation region 20. The p-well layer 6 contains p-type dopant. The n-well layer 7 contains n-type dopant. The p-well layer 6 has the bottom that is shallower than the bottom of the well isolation oxide film 5. The p-well layer 6 has the bottom that is shallower than the bottom 22c of the well isolation groove 4c. The n-well layer 7 has the bottom that is shallower than the bottom of the well isolation oxide film 5. The n-well layer 7 has the bottom that is shallower than the bottom 22c of the well isolation groove 4c. The p-well layer 6 and the n-well layer 7 have a depth $d_{67}$ from the surface 2a. The well isolation groove 4c and the well isolation oxide film 5 have a depth $d_{4c}$ from the surface 2a. The combed active regions 4b have a depth $d_{4a}$ from the surface 2a. The depth $d_{67}$ of the p-well layer 6 and the n-well layer 7 is shallower than the depth $d_{4c}$ of the well isolation groove 4c and the well isolation oxide film 5. The depth $d_{67}$ of the p-well layer 6 and the n-well layer 7 is deeper than the depth $d_{4a}$ of the combed active regions 4b.

These relationships of the depths can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. These relationships of the depths can effectively prevent that a thermal-diffusion of the ions introduced in the p-well layer 6 and the n-well layer 7 causes, in worst cases, the diffused portions of the p-well layer 6 and the n-well layer 7 to contact with each other under the well isolation oxide film 5 or to partially overlap each other under the well isolation oxide film 5, thereby reducing the junction voltage and causing latch-up.

The above relationships of the depths can effectively prevent remarkable reduction in the junction voltage and/or latch up, and can ensure that the semiconductor device is operable with the required performances. The width $W_{4c}$ of the well isolation oxide film 5 may have a necessary minimum width to avoid that a thermal-diffusion causes the distance between the p-well layer 6 and the n-well layer 7 to be as narrow as the semiconductor device is no longer operable with the required performances. The necessary minimum width $W_{4c}$ of the well isolation oxide film 5 would be effective to realize high density integration of the semiconductor device.

The diffusion stopper layer 8 can effectively prevent that a thermal-diffusion of the ions introduced in the p-well layer 6 and the n-well layer 7 causes the diffused portions of the p-well layer 6 and the n-well layer 7 to come closer to each other under the well isolation oxide film 5. The diffusion stopper layer 8 can effectively prevent that a thermal-diffusion of the ions introduced in the p-well layer 6 and the n-well layer 7 causes, in worst cases, the diffused portions of the p-well layer 6 and the n-well layer 7 to contact with each other under the well isolation oxide film 5 or to partially overlap each other under the well isolation oxide film 5, thereby reducing the junction voltage and causing latch-up.

The diffusion stopper layer 8 can effectively prevent remarkable reduction in the junction voltage and/or latch up, and can ensure that the semiconductor device is operable with the required performances. The diffusion stopper layer 8 can reduce the necessary minimum width as the width $W_{4c}$ of the well isolation oxide film 5, wherein the necessary minimum width needs to avoid that a thermal-diffusion causes the distance between the p-well layer 6 and the n-well layer 7 to be as narrow as the semiconductor device is no longer operable with the required performances. Further reduction of the necessary minimum width $W_{4c}$ of the well isolation oxide film 5 would be effective to realize high density integration of the semiconductor device.

Method of Forming Semiconductor Device:

A typical example of a method of forming a semiconductor device will be described with reference to FIGS. 6 through 11 which illustrate sequential steps involved in a method of forming a semiconductor device having a well isolation region with a narrower width in accordance with the first embodiment of the present invention.

The method of forming the semiconductor device 102 may be different from the above-described method of forming the semiconductor device 101 in forming the well isolation groove by using a photo-lithography process.

(Processes for Forming Oxide Film and Nitride Film)

Figure 6:
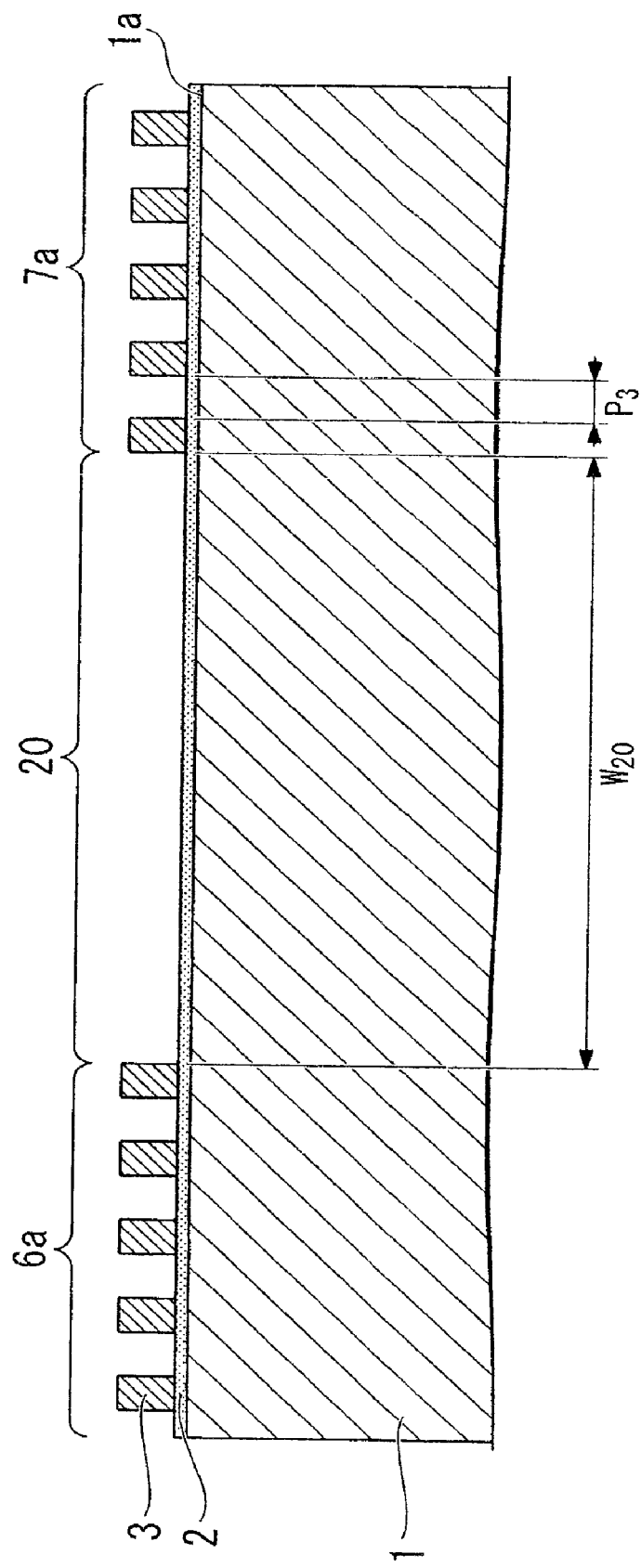
FIG. 6 is a fragmentary cross sectional elevation view illustrating a step involved in a method of forming a semiconductor device having a well isolation region with a narrower width in accordance with a second preferred embodiment of the present invention.

With reference to FIG. 6, a silicon oxide film 2 is formed on a surface 1a of a silicon substrate 1. The silicon oxide film 2 can be formed by a thermal oxidation process. The silicon oxide film 2 may have a thickness of 10 nanometers.

A silicon nitride film 3 is formed over the silicon oxide film 2. The silicon nitride film 3 can be formed by a chemical vapor deposition process. The silicon nitride film 3 may have a thickness of 80 nanometers.

(Processes for Forming Device Isolation Groove and Device Isolation Oxide Film)

A photo-resist film is applied on the silicon nitride film 3. A photo-lithography process is carried out to form a photo-resist pattern on the silicon nitride film 3. A dry etching process is carried out using the photo-resist pattern as a mask, thereby forming silicon nitride patterns 3 in a p-well region 6a and an n-well region 7a. The silicon nitride pattern 3 in each of the p-well region 6a and the n-well region 7a may have a constant pitch. The p-well region 6a and the n-well region 7a are separated by the well isolation region 20. The well isolation region 20 separates the p-well region 6a and the n-well region 7a from each other. The silicon nitride pattern 3 are absent in the well isolation region 20. The well isolation region 20 may have a width $W_{20}$. In some cases, the pitch of the silicon nitride pattern 3 may be, but not limited to, 100 nanometers, and the width $W_{20}$ of the well isolation region 20 may be, but is not limited to, 300 nanometers.

Figure 7:
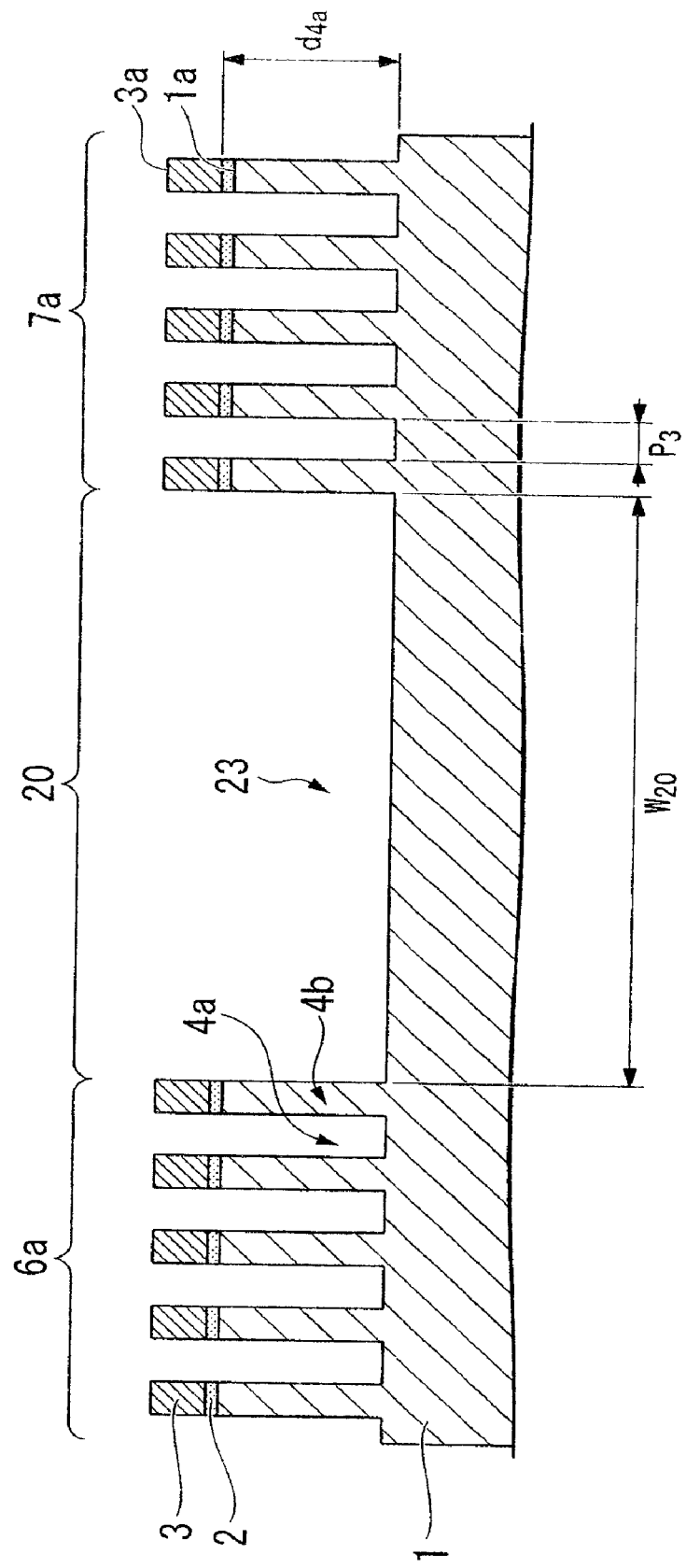
FIG. 7 is a fragmentary cross sectional elevation view illustrating a step subsequent to the step of FIG. 6, involved in the method of forming the semiconductor device in accordance with the second preferred embodiment of the present invention.

With reference to FIG. 7, a dry etching process is carried out using the silicon nitride patterns 3 as a mask to selectively etch the silicon oxide film 2 and the silicon substrate 1, thereby forming device isolation grooves 4a in the p-well region 6a and the n-well region 7a and forming a well isolation groove 23 in the well isolation region 20. The p-well region 6a and the n-well region 7a have the combed device isolation grooves 4a. The combed device isolation grooves 4a define the combed shape of vertical section of active regions 4b of the silicon substrate 1. The combed device isolation grooves 4a have a depth $d_{4a}$ from the bottom level of the silicon nitride patterns 3. The well isolation region 20 has the well isolation groove 23. The well isolation groove 23 has the depth $d_{4a}$ from the bottom level of the silicon nitride patterns 3. The well isolation groove 23 has the same depth as the device isolation grooves 4a. The depth $d_{4a}$ of the well isolation groove 23 and the device isolation grooves 4a may be, but is not limited to, 100 nanometers. The well isolation groove 23 has the width $W_{20}$. The width $W_{20}$ of the well isolation groove 23 may be, but is not limited to, 300 nanometers.

Figure 8:
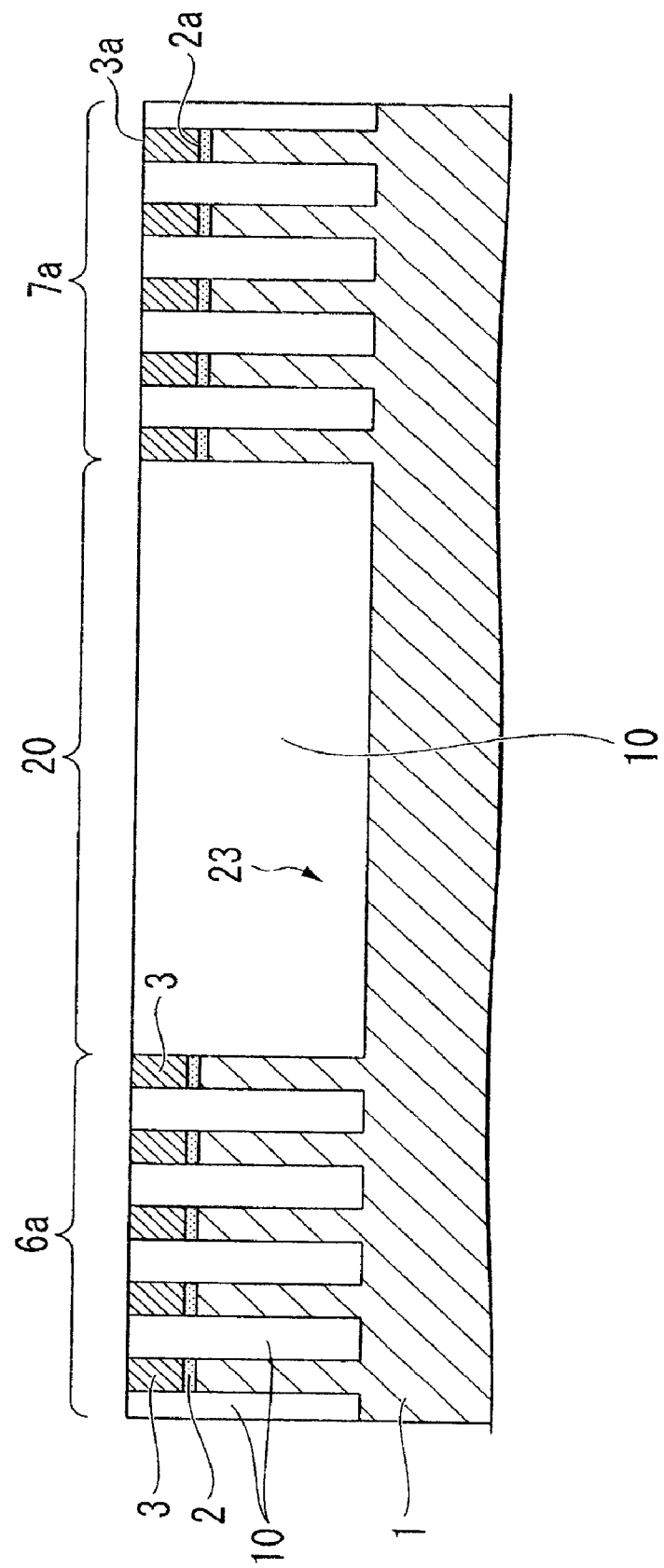
FIG. 8 is a fragmentary cross sectional elevation view illustrating a step subsequent to the step of FIG. 7, involved in the method of forming the semiconductor device in accordance with the second preferred embodiment of the present invention.

With reference to FIG. 8, a device isolation oxide film 10 is formed entirely so that the device isolation oxide film 10 covers the silicon nitride patterns 3 as well as fills up the combed device isolation grooves 4a and also fills up the well isolation groove 23. The combed active regions 4b are separated from each other by the device isolation oxide film 10. In some cases, the device isolation oxide film 10 can be formed by, but not limited to, a high density plasma process. The device isolation oxide film 10 may have a thickness that is sufficiently thicker so that the device isolation oxide film 10 fills up the device isolation grooves 4a and the well isolation groove 23. In some cases, the thickness of the device isolation oxide film 10 may be, but is not limited to, 300 nanometers.

A chemical mechanical polishing process can be carried out to planarize the device isolation oxide film 10, so that the top portions 3a of the silicon nitride patterns 3 are shown, while the device isolation oxide film 10 fills up the device isolation grooves 4a and the well isolation groove 23.

(Processes for Forming Well Isolation Groove and Diffusion Stopper Layer)

With reference to FIG. 9, a wet etching process for silicon oxide is carried out to etch the device isolation oxide film 10 by a depth that corresponds to the thickness of the silicon nitride patterns 3. Subsequently, a wet etching process for silicon nitride is carried out to etch the silicon nitride patterns 3, so that the surfaces 2a of the silicon oxide films 2 are shown. The surfaces 2a of the silicon oxide films 2 are leveled to the surfaces of the device isolation oxide film 10.

A protection silicon nitride film 9 is entirely formed, which extends over the surfaces 2a of the silicon oxide films 2 and the surfaces of the device isolation oxide film 10. The protection silicon nitride film 9 extends over the p-well region 6a, the n-well region 7a and the well isolation region 20. In some cases, the protection silicon nitride film 9 may be formed by a chemical vapor deposition process. The thickness of the protection silicon nitride film 9 may be, but is not limited to, 80 nanometers.

With reference to FIG. 10, a photo-resist film is applied on the protection silicon nitride film 9. A photo-lithography process is carried out to form a photo-resist pattern on the protection silicon nitride film 9. A dry etching process is carried out using the photo-resist pattern as a mask, thereby selectively removing the protection silicon nitride film 9, the device isolation oxide film 10 and the silicon substrate 1 in the well isolation region 20. The silicon substrate 1 is thus etched by a predetermined depth, for example, but not limited to, 50 nanometers. As a result of the dry etching process using the photo-resist pattern as a mask, a well isolation groove 4c is selectively formed in the well isolation region 20. In some cases, the width $W_{4c}$ of the well isolation groove 4c may be, but is not limited to, 150 nanometers, and the depth $d_{4c}$ of the well isolation groove 4c may be, but is not limited to, 240 nanometers. The well isolation groove 4c has the bottom surface 22c that is defined by the surface of the silicon substrate 1.

An ion-implantation process can be carried out to selectively introduce diffusion stopper elements into the silicon substrate 1 under the well isolation groove 4c in the well isolation region 20, thereby forming a diffusion stopper layer 8. The diffusion stopper layer 8 extends under the bottom surface 22c of the well isolation groove 4c.

The ion-implantation process can be carried out, but not limited to, conditions of acceleration energy of 20 keV and at a dose of $1E15/cm^2$. Carbon can be selected as the diffusion stopper element to be introduced by the ion-implantation process. It is also possible to select nitrogen, fluorine and germanium solely or in combination thereof.

(Process for Forming Well Isolation Oxide Film)

With reference to FIG. 11, a high density plasma process is carried out to form a well isolation oxide film 5 entirely so that the well isolation oxide film 5 covers the p-well region 6a and the n-well region 7a and fills up the well isolation groove 4c in the well isolation region 20. The well isolation oxide film 5 extends over the protection silicon nitride film 9 and fills up the well isolation groove 4c. The thickness of the well isolation oxide film 5 may be, but is not limited to, 300 nanometers.

A chemical mechanical polishing process can be carried out to planarize the well isolation oxide film 5, so that the well isolation oxide film 5 remains filling up the well isolation groove 4c in the well isolation region 20, while the top surfaces 9a of the protection silicon nitride film 9 are shown. The well isolation oxide film 5 with the planarized surface is formed, which fills up the well isolation groove 4c in the well isolation region 20.

(Processes for Forming P-Well Layer and N-Well Layer)

A wet etching process for silicon oxide is carried out to selectively etch the well isolation oxide film 5 by the same depth as the thickness of the protection silicon nitride film 9, so that the top surface of the well isolation oxide film 5 is substantially the same level as the bottom level of the protection silicon nitride film 9. Another wet etching process for silicon nitride is carried out to remove the protection silicon nitride film 9, so that the top surfaces 2a of the silicon oxide films 2 are shown. The top surface of the well isolation oxide film 5 is leveled to the top surfaces 2a of the silicon oxide films 2.

A photo-resist film is applied on the silicon oxide films 2, the device isolation oxide film 10, and the well isolation oxide film 5. A photo-lithography process is carried out to form a photo-resist pattern that covers the well isolation region 20 and the n-well region 7a. Boron ions are implanted into the p-well region 6a, while the photo-resist mask covers the well isolation region 20 and the n-well region 7a, thereby selectively forming a p-well layer 6 in the p-well region 6a. The photo-resist mask as used for forming the p-well layer 6 is removed. The p-well layer 6 has the bottom that is shallower than the bottom of the well isolation oxide film 5. The p-well layer 6 has the bottom that is shallower than the bottom 22c of the well isolation groove 4c. The p-well layer 6 has a depth $d_{67}$ from the surface 2a. The depth $d_{67}$ of the p-well layer 6 is shallower than the depth $d_{4c}$ of the well isolation groove 4c and the well isolation oxide film 5. The depth $d_{67}$ of the p-well layer 6 is deeper than the depth $d_{4a}$ of the device isolation grooves 4a.

Another photo-lithography process is carried out to form another photo-resist mask that covers the well isolation region 20 and the p-well region 6a. Phosphorus ions are implanted into the n-well region 7a, while the photo-resist mask covers the well isolation region 20 and the p-well region 6a, thereby selectively forming an n-well layer 7 in the n-well region 7a. The n-well layer 7 has the bottom that is shallower than the bottom of the well isolation oxide film 5. The n-well layer 7 has the bottom that is shallower than the bottom 22c of the well isolation groove 4c. The n-well layer 7 has the depth $d_{67}$ from the surface 2a. The depth $d_{67}$ of the n-well layer 7 is shallower than the depth $d_{4c}$ of the well isolation groove 4c and the well isolation oxide film 5. The depth $d_{67}$ of the n-well layer 7 is deeper than the depth $d_{4a}$ of the device isolation grooves 4a. It is also possible that the n-well layer 7 is formed before the p-well layer 6 is formed. Other processes for forming the p-well layer 6 and the n-well layer 7 than those described above may be available. In some cases, p-type ions are entirely introduced and then n-type ions are selectively introduced into the n-well region 7a. In other cases, n-type ions are entirely introduced and then p-type ions are selectively introduced into the p-well region 6a. In any processes described above, the p-well layer 6 and the n-well layer 7 can be formed easily.

The p-well layer 6, the n-well layer 7, and the diffusion stopper layer 8 can be formed as described above. As a result of those processes described above with reference to FIGS. 6 through 11, the semiconductor device 102 shown in FIG. 11 is formed.

The well isolation groove 4c is selectively formed in the well isolation region 20, wherein the width $W_{4c}$ of the well isolation groove 4c is narrower than the width $W_{20}$ of the well isolation region 20. Since the well isolation groove 4c is formed by the photo-lithography process, it is easy to adequately narrow the width $W_{4c}$ of the well isolation groove 4c. This can allow further increase in the density of integration of the semiconductor device 102.

The above described processes forms the well isolation groove 4c having the bottom 22c which has the depth $d_{4c}$ which is deeper than the depth $d_{67}$ of the p-well layer 6 and the n-well layer 7 which is deeper than the depth $d_{4c}$ of the well isolation groove 22. The diffusion stopper element is selectively introduced into the substrate 1 under the bottom 22c of the well isolation groove 4c in the well isolation region 20, thereby forming the diffusion stopper layer 8 which extends under the bottom 22c of the well isolation groove 4c. No diffusion stopper element is introduced into the p-well layer 6 and the n-well layer 7, in order to avoid any deterioration of the performances of the semiconductor device 102. Selective introduction of the diffusion stopper element into the substrate 1 under the bottom 22c of the well isolation groove 4c without introducing the diffusion stopper element into the p-well layer 6 and the n-well layer 7 can prevent that the leakage of current $I_{off}$ is increased.

Other Method of Forming Semiconductor Device:

Another typical example of the method of forming the semiconductor device 102 will be described with reference to FIGS. 12 through 17 which illustrate sequential steps involved in a method of forming a semiconductor device having a well isolation region with a narrower width in accordance with the second embodiment of the present invention.

The method of forming the semiconductor device 102 may include, but is not limited to, processes for forming an oxide film and a nitride film, processes for forming a well isolation groove and a diffusion stopper layer, processes for forming a well isolation oxide film, processes for forming device isolation grooves and device isolation oxide films, and processes for forming p-well layer and n-well layer. The processes for forming an oxide film and a nitride film may include, but are not limited to, forming an oxide film on a surface of a substrate and subsequently forming a nitride film over the oxide film. The processes for forming a well isolation groove and a diffusion stopper layer may include, but are not limited to, forming a well isolation groove in the nitride film, the oxide film and the substrate, and subsequently introducing diffusion stopper elements into the substrate under the well isolation groove, thereby forming a diffusion stopper layer under the well isolation groove. The processes for forming a well isolation oxide film may include, but are not limited to, forming a well isolation oxide film that fills the well isolation groove. The processes for forming device isolation grooves and device isolation oxide films may include, but are not limited to, forming a device isolation groove in the nitride film, the oxide film and the substrate, forming active regions in the substrate, and forming a device isolation oxide film that fills the device isolation groove. The processes for forming p-well layer and n-well layer may include, but are not limited to, selectively introducing a p-type dopant in the active region to form a p-well layer and selectively introducing an n-type dopant in the active region to form an n-well layer, wherein the bottoms of the p-well layer and the n-well layer are deeper than the bottom of the device isolation grooves and shallower than the bottom of the well isolation groove.

(Processes for Forming Oxide Film and Nitride Film)

Figure 12:
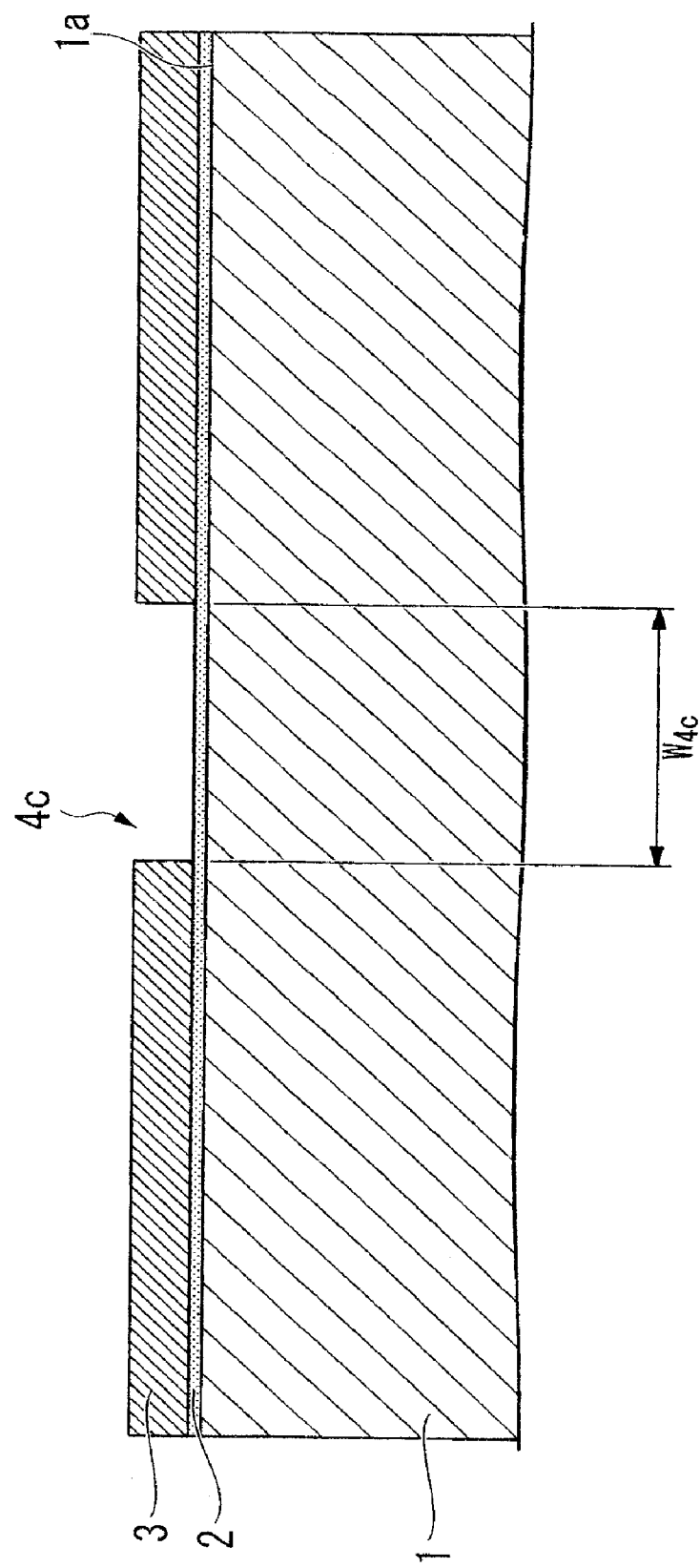
FIG. 12 is a fragmentary cross sectional elevation view illustrating a step involved in a method of forming a semiconductor device having a well isolation region with a narrower width in accordance with another example of the second preferred embodiment of the present invention.

With reference to FIG. 12, a silicon oxide film 2 is formed on a surface 1a of a silicon substrate 1. The silicon oxide film 2 can be formed by a thermal oxidation process. The silicon oxide film 2 may have a thickness of 10 nanometers.

A silicon nitride film 3 is formed over the silicon oxide film 2. The silicon nitride film 3 can be formed by a chemical vapor deposition process. The silicon nitride film 3 may have a thickness of 80 nanometers.

(Processes for Forming Well Isolation Groove and Diffusion Stopper Layer)

A photo-resist film is applied on the silicon nitride film 3. A photo-lithography process is carried out to form a photo-resist pattern on the silicon nitride film 3. A dry etching process is carried out using the photo-resist pattern as a mask, thereby forming a silicon nitride pattern 3 that has a well isolation groove 4c with a width $W_{4c}$. The width $W_{4c}$ of the well isolation groove 4c may be, but is not limited to, 150 nanometers.

Figure 13:
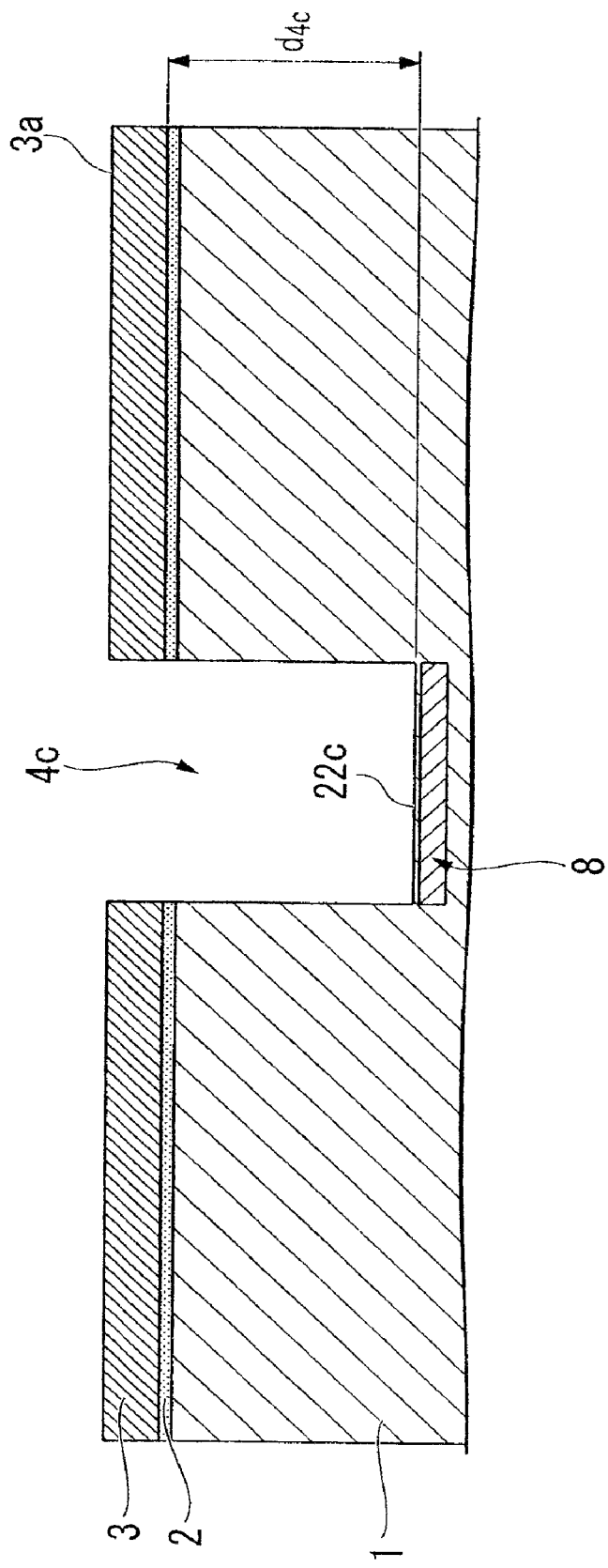
FIG. 13 is a fragmentary cross sectional elevation view illustrating a step subsequent to the step of FIG. 12, involved in the method of forming the semiconductor device in accordance with the other example of the second preferred embodiment of the present invention.

With reference to FIG. 13, a dry etching process for silicon oxide is carried out using the silicon nitride pattern 3 as a mask, so that the silicon oxide film 2 is etched by 10 nanometers. Another dry etching process for silicon is carried out using the silicon nitride pattern 3 as a mask, so that the silicon substrate 1 is etched by 100 nanometers. As a result of the dry etching processes using the silicon nitride pattern 3 as a mask, a well isolation groove 4c is formed, which has a depth $d_{4c}$ from the top level of the silicon oxide film 2. The well isolation groove 4c has the bottom surface 22c that has the depth $d_{4c}$.

An ion-implantation process can be carried out to selectively introduce diffusion stopper elements into the silicon substrate 1 under the well isolation groove 4c, thereby forming a diffusion stopper layer 8. The diffusion stopper layer 8 extends under the bottom surface 22c of the well isolation groove 4c.

The ion-implantation process can be carried out, but not limited to, conditions of acceleration energy of 20 keV and at a dose of $1E15/cm^2$. Carbon can be selected as the diffusion stopper element to be introduced by the ion-implantation process. It is also possible to select nitrogen, fluorine and germanium solely or in combination thereof.

(Process for Forming Well Isolation Oxide Film)

Figure 14:
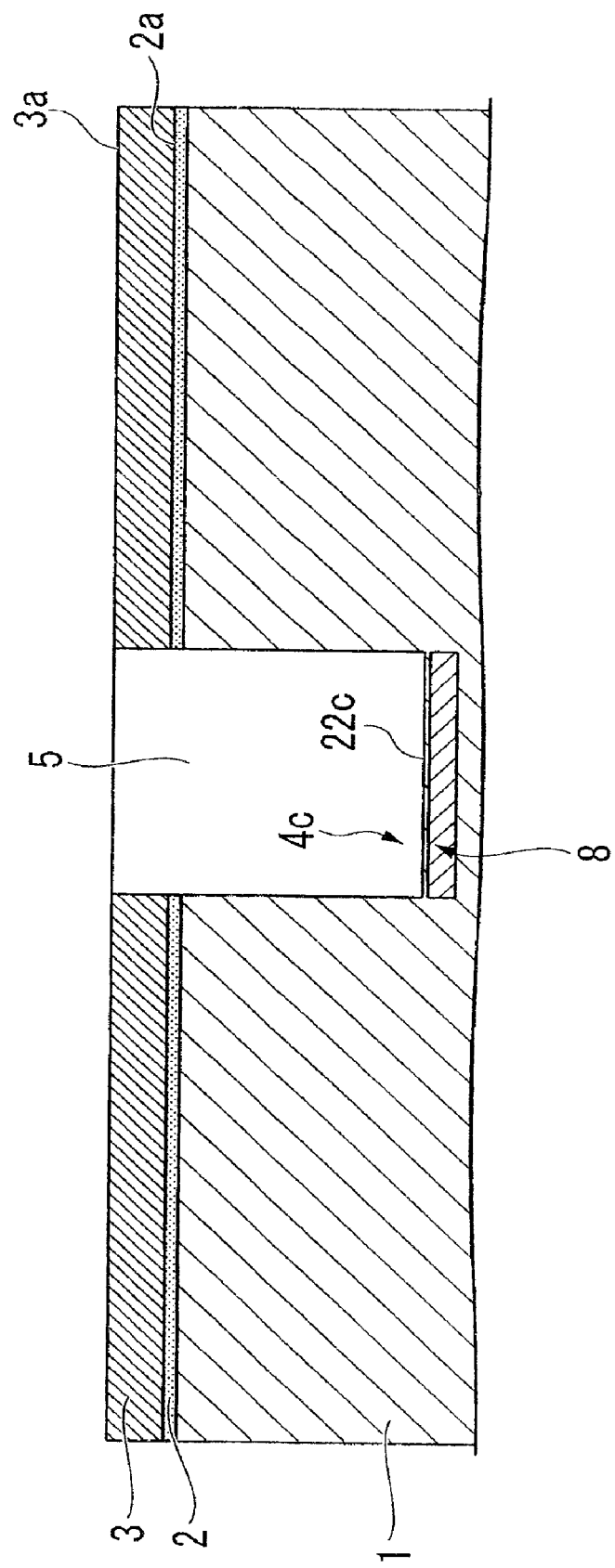
FIG. 14 is a fragmentary cross sectional elevation view illustrating a step subsequent to the step of FIG. 13, involved in the method of forming the semiconductor device in accordance with the other example of the second preferred embodiment of the present invention.

With reference to FIG. 14, a high density plasma process is carried out to form a well isolation oxide film 5 entirely so that the well isolation oxide film 5 covers the silicon nitride pattern 3 and fills up the well isolation groove 4c. The thickness of the well isolation oxide film 5 may be, but is not limited to, 300 nanometers.

A chemical mechanical polishing process can be carried out to planarize the well isolation oxide film 5, so that the well isolation oxide film 5 remains filling up the well isolation groove 4c, while the top surface 3a of the silicon nitride pattern 3 is shown. The well isolation oxide film 5 with the planarized surface is formed, which fills up the well isolation groove 4c.

(Processes for Forming Device Isolation Groove and Device Isolation Oxide Film)

Figure 15:
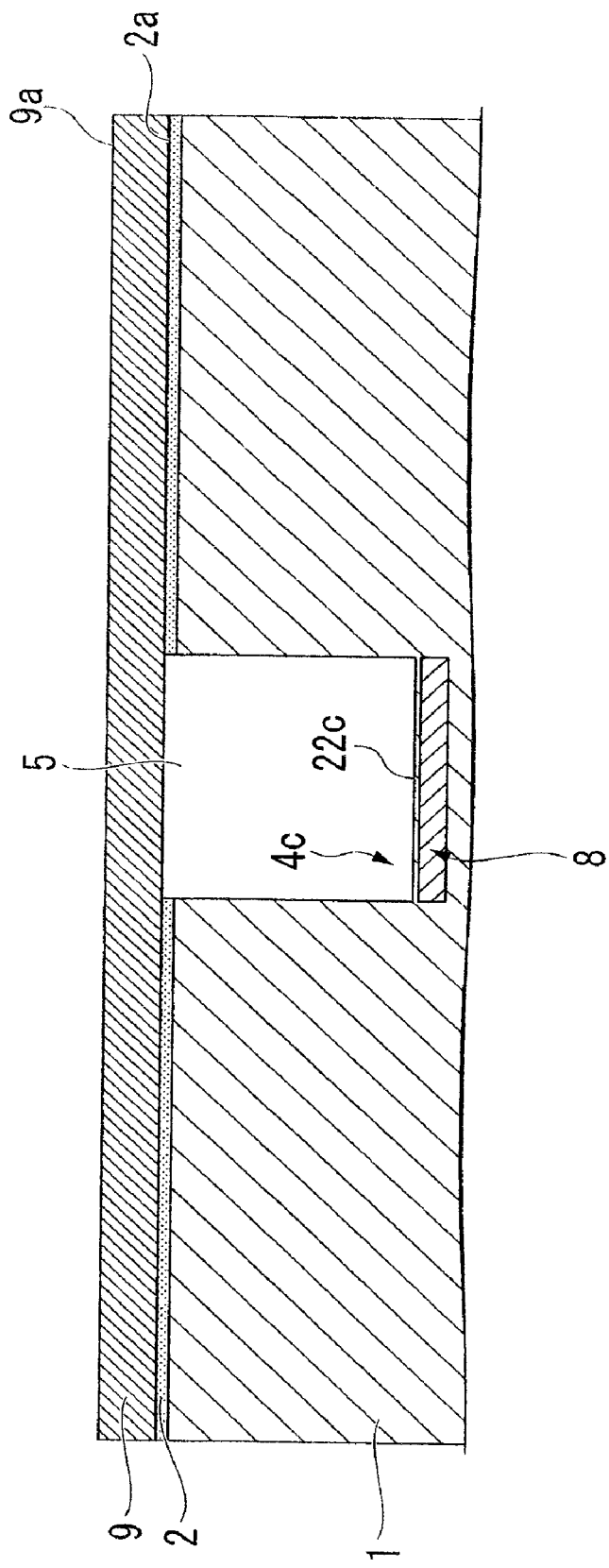
FIG. 15 is a fragmentary cross sectional elevation view illustrating a step subsequent to the step of FIG. 14, involved in the method of forming the semiconductor device in accordance with the other example of the second preferred embodiment of the present invention.

With reference to FIG. 15, a wet etching process for silicon oxide is carried out to etch the well isolation oxide film 5 by a depth that corresponds to the thickness of the silicon nitride pattern 3. Subsequently, a wet etching process for silicon nitride is carried out to etch the silicon nitride pattern 3, so that the surface 2a of the silicon oxide film 2 is shown. The surface 2a of the silicon oxide film 2 is leveled to the etched surface of the well isolation oxide film 5.

A protection silicon nitride film 9 is entirely formed, which extends over the surface 2a of the silicon oxide film 2 and the surface of the well isolation oxide film 5. In some cases, the protection silicon nitride film 9 may be formed by a chemical vapor deposition process. The thickness of the protection silicon nitride film 9 may be, but is not limited to, 80 nanometers.

Figure 16:
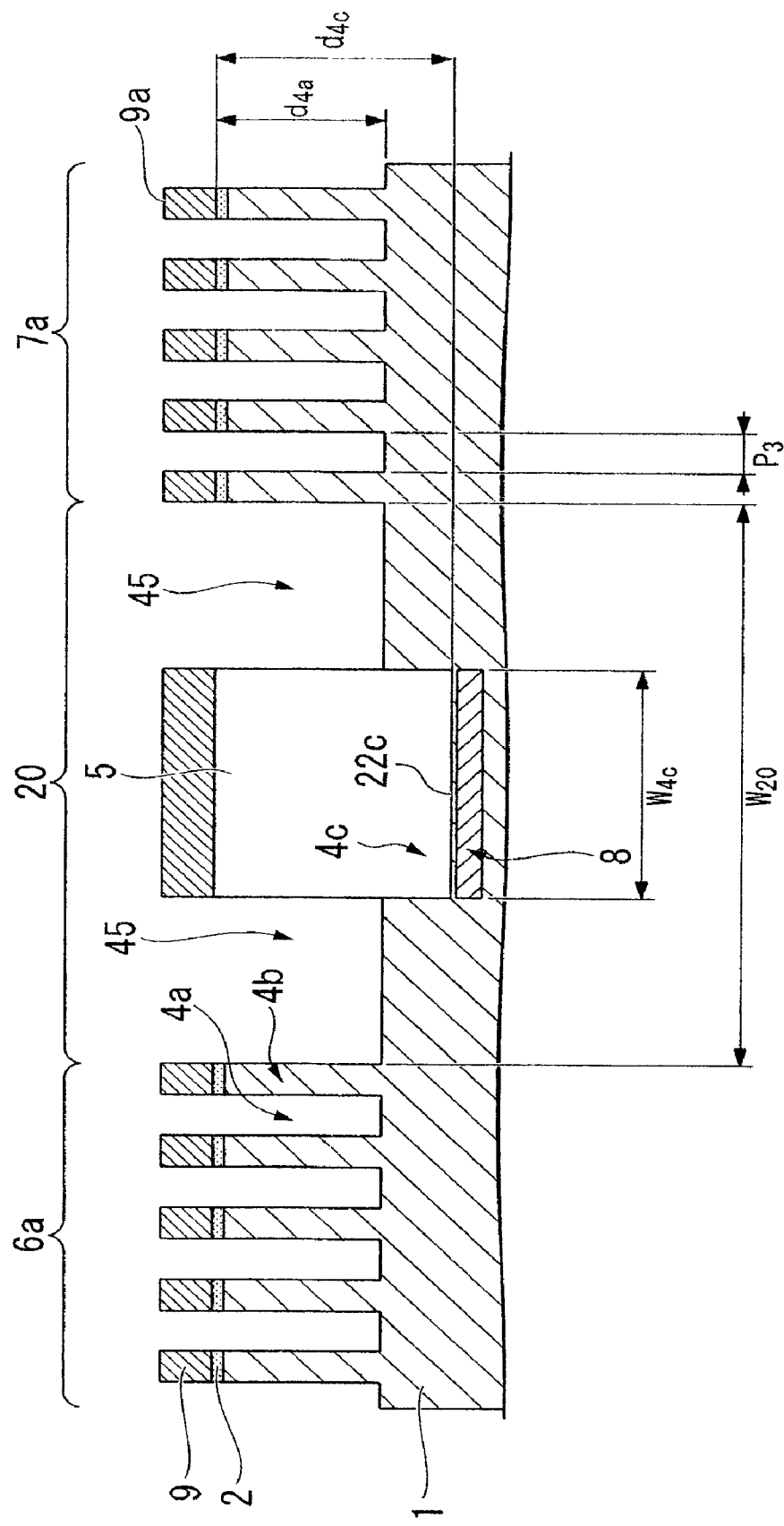
FIG. 16 is a fragmentary cross sectional elevation view illustrating a step subsequent to the step of FIG. 15, involved in the method of forming the semiconductor device in accordance with the other example of the second preferred embodiment of the present invention.

With reference to FIG. 16, a photo-resist film is applied on the protection silicon nitride film 9. A photo-lithography process is carried out to form a photo-resist pattern on the protection silicon nitride film 9. A dry etching process is carried out using the photo-resist pattern as a mask, thereby selectively removing the protection silicon nitride film 9. As a result, protection silicon nitride patterns 9 are formed over the silicon oxide film 2 and the surface of the well isolation oxide film 5. The protection silicon nitride patterns 9 define the p-well region 6a, the n-well region 7a and the well isolation region 20. The well isolation region 20 is positioned between the p-well region 6a and the n-well region 7a. The width $W_{20}$ of the well isolation region 20 may be, but is not limited to, 150 nanometers.

A dry etching process is carried out using the protection silicon nitride patterns 9 as a mask to selectively etch the silicon oxide film 2 and the silicon substrate 1, thereby forming device isolation grooves 4a in the p-well region 6a and the n-well region 7a and forming openings 45 in the well isolation region 20. The p-well region 6a and the n-well region 7a have the combed device isolation grooves 4a. The combed device isolation grooves 4a define the combed shape of vertical section of active regions 4b of the silicon substrate 1. The combed device isolation grooves 4a have a depth $d_{4a}$ from the bottom level of the protection silicon nitride patterns 9. The well isolation region 20 has the openings 45 and the well isolation oxide film 5. The openings 45 have the depth $d_{4a}$ from the bottom level of the protection silicon nitride patterns 9. The openings 45 have the same depth as the device isolation grooves 4a. The depth $d_{4a}$ of the openings 45 and the device isolation grooves 4a may be, but is not limited to, 100 nanometers. The well isolation oxide film 5 is separated by the openings 45 from the active regions 4b in the p-well region 6a and the n-well region 7a.

Figure 17:
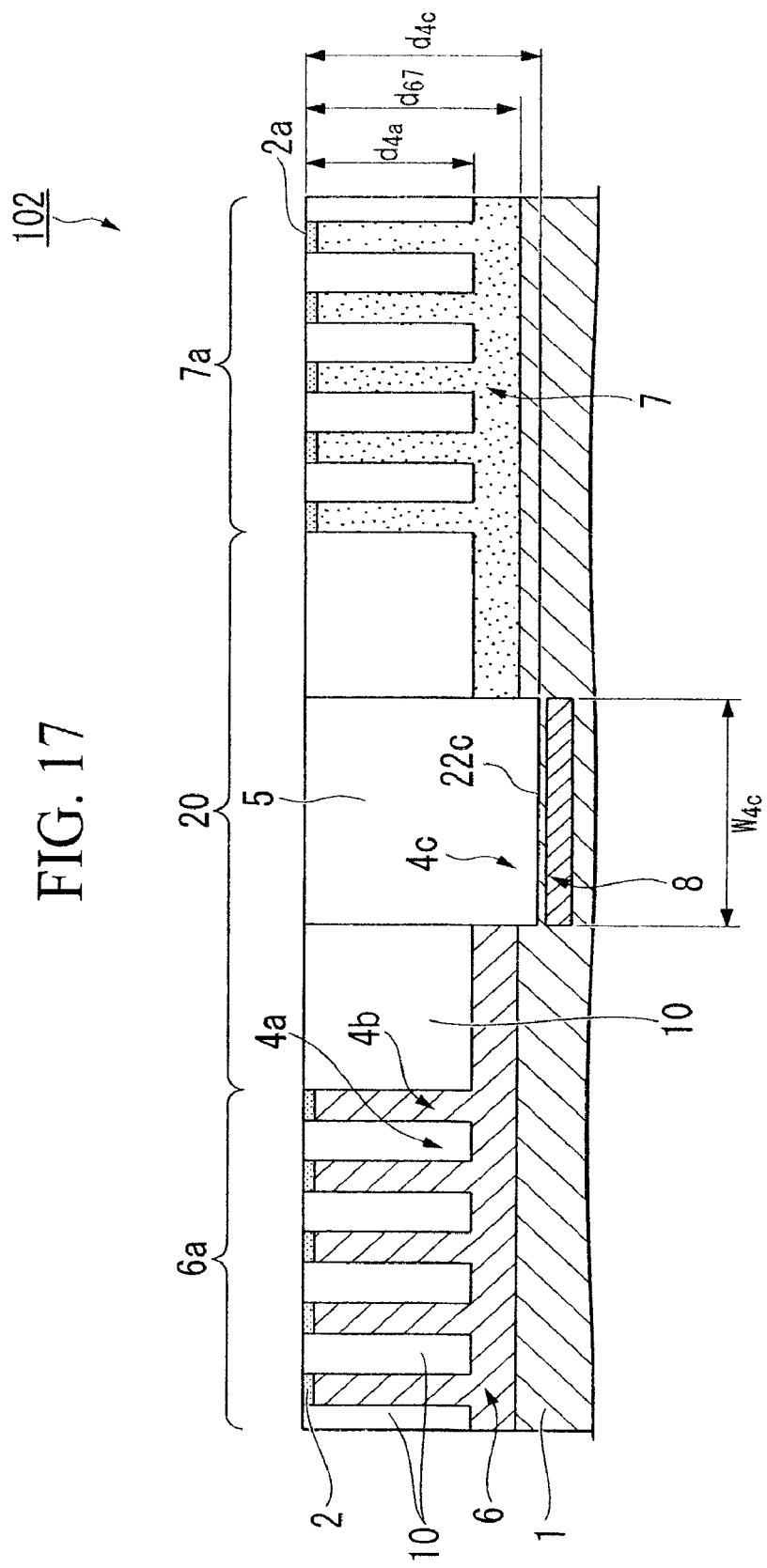
FIG. 17 is a fragmentary cross sectional elevation view illustrating a step subsequent to the step of FIG. 16, involved in the method of forming the semiconductor device in accordance with the other example of the second preferred embodiment of the present invention.

With reference to FIG. 17, a device isolation oxide film 10 is formed entirely so that the device isolation oxide film 10 covers the protection silicon nitride patterns 9 as well as fills up the combed device isolation grooves 4a and also fills up the openings 45. The combed active regions 4b are separated from each other by the device isolation oxide film 10. In some cases, the device isolation oxide film 10 can be formed by, but not limited to, a high density plasma process. The device isolation oxide film 10 may have a thickness that is sufficiently thicker so that the device isolation oxide film 10 fills up the device isolation grooves 4a and the openings 45. In some cases, the thickness of the device isolation oxide film 10 may be, but is not limited to, 300 nanometers.

A chemical mechanical polishing process can be carried out to planarize the device isolation oxide film 10, so that the top portions 9a of the protection silicon nitride patterns 9 are shown, while the device isolation oxide film 10 fills up the device isolation grooves 4a and the openings 45.

(Processes for Forming P-Well Layer and N-Well Layer)

A wet etching process for silicon oxide is carried out to selectively etch the device isolation oxide film 10 by the same depth as the thickness of the protection silicon nitride patterns 9, so that the top surface of the device isolation oxide film 10 is substantially the same level as the bottom level of the protection silicon nitride patterns 9. Another wet etching process for silicon nitride is carried out to remove the protection silicon nitride patterns 9, so that the top surfaces 2a of the silicon oxide films 2 are shown. The top surface of the device isolation oxide film 10 is leveled to the top surfaces 2a of the silicon oxide films 2.

A photo-resist film is applied on the silicon oxide films 2, the device isolation oxide film 10, and the well isolation oxide film 5. A photo-lithography process is carried out to form a photo-resist pattern that covers the well isolation region 20 and the n-well region 7a. Boron ions are implanted into the p-well region 6a, while the photo-resist mask covers the well isolation region 20 and the n-well region 7a, thereby selectively forming a p-well layer 6 in the p-well region 6a. The photo-resist mask as used for forming the p-well layer 6 is removed. The p-well layer 6 has the bottom that is shallower than the bottom of the well isolation oxide film 5. The p-well layer 6 has the bottom that is shallower than the bottom 22c of the well isolation groove 4c. The p-well layer 6 has a depth $d_{67}$ from the surface 2a. The depth $d_{67}$ of the p-well layer 6 is shallower than the depth $d_{4c}$ of the well isolation groove 4c and the well isolation oxide film 5. The depth $d_{67}$ of the p-well layer 6 is deeper than the depth $d_{4a}$ of the device isolation grooves 4a.

Another photo-lithography process is carried out to form another photo-resist mask that covers the well isolation region 20 and the p-well region 6a. Phosphorus ions are implanted into the n-well region 7a, while the photo-resist mask covers the well isolation region 20 and the p-well region 6a, thereby selectively forming an n-well layer 7 in the n-well region 7a. The n-well layer 7 has the bottom that is shallower than the bottom of the well isolation oxide film 5. The n-well layer 7 has the bottom that is shallower than the bottom 22c of the well isolation groove 4c. The n-well layer 7 has the depth $d_{67}$ from the surface 2a. The depth $d_{67}$ of the n-well layer 7 is shallower than the depth $d_{4c}$ of the well isolation groove 4c and the well isolation oxide film 5. The depth $d_{67}$ of the n-well layer 7 is deeper than the depth $d_{4a}$ of the device isolation grooves 4a. It is also possible that the n-well layer 7 is formed before the p-well layer 6 is formed. Other processes for forming the p-well layer 6 and the n-well layer 7 than those described above may be available. In some cases, p-type ions are entirely introduced and then n-type ions are selectively introduced into the n-well region 7a. In other cases, n-type ions are entirely introduced and then p-type ions are selectively introduced into the p-well region 6a. In any processes described above, the p-well layer 6 and the n-well layer 7 can be formed easily.

The p-well layer 6, the n-well layer 7, and the diffusion stopper layer 8 can be formed as described above. As a result of those processes described above with reference to FIGS. 12 through 17, the semiconductor device 102 shown in FIG. 17 is formed.

The well isolation groove 4c is selectively formed in the well isolation region 20, wherein the width $W_{4c}$ of the well isolation groove 4c is narrower than the width $W_{20}$ of the well isolation region 20. Since the well isolation groove 4c is formed by the photo-lithography process, it is easy to adequately narrow the width $W_{4c}$ of the well isolation groove 4c. This can allow further increase in the density of integration of the semiconductor device 102.

The above described processes forms the well isolation groove 4c having the bottom 22c which has the depth $d_{4c}$ which is deeper than the depth $d_{67}$ of the p-well layer 6 and the n-well layer 7 which is deeper than the depth $d_{4c}$ of the well isolation groove 22. The diffusion stopper element is selectively introduced into the substrate 1 under the bottom 22c of the well isolation groove 4c in the well isolation region 20, thereby forming the diffusion stopper layer 8 which extends under the bottom 22c of the well isolation groove 4c. No diffusion stopper element is introduced into the p-well layer 6 and the n-well layer 7, in order to avoid any deterioration of the performances of the semiconductor device 102. Selective introduction of the diffusion stopper element into the substrate 1 under the bottom 22c of the well isolation groove 4c without introducing the diffusion stopper element into the p-well layer 6 and the n-well layer 7 can prevent that the leakage of current $I_{off}$ is increased.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device comprising:
    forming a device isolation groove in a semiconductor substrate, the device isolation groove defining an active region of the semiconductor substrate;
    forming a device isolation insulating film that fills the device isolation groove;
    forming a well isolation groove in the semiconductor substrate, the well isolation groove being deeper in depth than the device isolation groove;
    forming a diffusion stopper layer under a bottom of the well isolation groove;
    forming a well isolation insulating film that fills the well isolation groove;
    selectively forming first and second well layers in the active region of the semiconductor substrate, the first and second well layers having first and second bottoms respectively, and the first and second bottoms being deeper in depth than a bottom of the device isolation groove and shallower in depth than the bottom of the well isolation groove.

2. The method according to claim 1, wherein forming the well isolation insulating film comprises utilizing micro loading effect.

3. The method according to claim 1, wherein forming the well isolation insulating film comprises a photolithography process.

4. The method according to claim 1, wherein forming the diffusion stopper layer comprises introducing at least one of carbon, nitrogen, fluorine, and germanium into the semiconductor substrate under the well isolation groove.

5. The method according to claim 1, further comprising:
    forming an oxide film on a surface of the semiconductor substrate;
    forming a nitride film on the oxide film; and
    selectively removing the nitride film to form a nitride pattern, and
    wherein forming the device isolation groove comprises carrying out a dry etching process using the nitride pattern as a mask.

6. The method according to claim 1, wherein selectively forming the first and second well layers comprises:
    selectively introducing first and second impurities into the active region of the semiconductor substrate at first and second depths, the first and second depths being deeper in depth than a bottom of the device isolation groove and shallower in depth than the bottom of the well isolation groove.

7. The method according to claim 6, wherein selectively introducing the first and second impurities comprises:
- carrying out a first ion-implantation process using a first mask for selectively introducing the first impurity; and
- carrying out a second ion-implantation process using a second mask for selectively introducing the second impurity.

8. A method of forming a semiconductor device comprising:
- forming a well isolation groove in a semiconductor substrate;
- forming a diffusion stopper layer under a bottom of the well isolation groove;
- forming a well isolation insulating film that fills the well isolation groove;
- forming a device isolation groove in the semiconductor substrate, the device isolation groove defining an active region of the semiconductor substrate, the device isolation groove being shallower in depth than the well isolation groove;
- forming a device isolation insulating film that fills the device isolation groove;
- selectively forming first and second well layers in the active region of the semiconductor substrate, the first and second well layers having first and second bottoms respectively, and the first and second bottoms being deeper in depth than a bottom of the device isolation groove and shallower in depth than the bottom of the well isolation groove.

9. The method according to claim 8, wherein forming the well isolation insulating film comprises utilizing micro loading effect.

10. The method according to claim 8, wherein forming the well isolation insulating film comprises a photolithography process.

11. The method according to claim 8, wherein forming the diffusion stopper layer comprises introducing at least one of carbon, nitrogen, fluorine, and germanium into the semiconductor substrate under the well isolation groove.

12. The method according to claim 8, further comprising:
- forming an oxide film on a surface of the semiconductor substrate;
- forming a nitride film on the oxide film; and
- selectively removing the nitride film to form a nitride pattern, and
- wherein forming the well isolation groove comprises carrying out a dry etching process using the nitride pattern as a mask.

13. The method according to claim 8, wherein selectively forming the first and second well layers comprises:
- selectively introducing first and second impurities into the active region of the semiconductor substrate at first and second depths, the first and second depths being deeper in depth than a bottom of the device isolation groove and shallower in depth than the bottom of the well isolation groove.

14. The method according to claim 13, wherein selectively introducing the first and second impurities comprises:
- carrying out a first ion-implantation process using a first mask for selectively introducing the first impurity; and
- carrying out a second ion-implantation process using a second mask for selectively introducing the second impurity.

* * * * *